United States Patent
Shimada et al.

(10) Patent No.: US 10,793,718 B2
(45) Date of Patent: Oct. 6, 2020

(54) RESIN COMPOSITION, AND SHEET, LAMINATE, POWER SEMICONDUCTOR DEVICE, AND PLASMA PROCESSING APPARATUS INCLUDING THE SAME, AND METHOD OF PRODUCING SEMICONDUCTOR USING THE SAME

(71) Applicant: Toray Industries, Inc., Tokyo (JP)

(72) Inventors: Akira Shimada, Otsu (JP); Masao Tomikawa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 82 days.

(21) Appl. No.: 16/315,486

(22) PCT Filed: Jul. 18, 2017

(86) PCT No.: PCT/JP2017/025885
§ 371 (c)(1),
(2) Date: Jan. 4, 2019

(87) PCT Pub. No.: WO2018/030079
PCT Pub. Date: Feb. 15, 2018

(65) Prior Publication Data
US 2019/0345332 A1    Nov. 14, 2019

(30) Foreign Application Priority Data

Aug. 8, 2016    (JP) .................................. 2016-155236

(51) Int. Cl.
| | | |
|---|---|---|
| C08L 79/08 | (2006.01) | |
| C08G 73/10 | (2006.01) | |
| H01L 21/3065 | (2006.01) | |
| H01L 23/373 | (2006.01) | |
| B32B 9/00 | (2006.01) | |
| B32B 9/04 | (2006.01) | |
| B32B 15/08 | (2006.01) | |

(52) U.S. Cl.
CPC .......... *C08L 79/08* (2013.01); *C08G 73/1067* (2013.01); *H01L 21/3065* (2013.01); *H01L 23/373* (2013.01); *B32B 9/005* (2013.01); *B32B 9/045* (2013.01); *B32B 15/08* (2013.01)

(58) Field of Classification Search
CPC ..................................................... C08L 79/08
See application file for complete search history.

(56) References Cited

U.S. PATENT DOCUMENTS

| | | | |
|---|---|---|---|
| 2008/0166894 A1 | 7/2008 | Miyagawa et al. | |
| 2010/0056730 A1* | 3/2010 | Yoneda | C08G 73/106 525/408 |
| 2010/0295190 A1 | 11/2010 | Mitsukura et al. | |
| 2012/0196075 A1* | 8/2012 | Takahashi | H01L 23/293 428/64.1 |
| 2013/0245160 A1* | 9/2013 | Shimada | C09J 183/10 523/457 |
| 2015/0318227 A1 | 11/2015 | Shimada et al. | |

FOREIGN PATENT DOCUMENTS

| | | |
|---|---|---|
| JP | 05117621 A | 5/1993 |
| JP | 2004319823 A | 11/2004 |
| JP | 2008171899 A | 7/2008 |
| JP | 2008266378 A | 11/2008 |
| JP | 2010053223 A | 3/2010 |
| JP | 2010248349 A | 11/2010 |
| JP | 2011151280 A | 8/2011 |
| JP | 2012255061 A | 12/2012 |
| JP | 2013030727 A | 2/2013 |
| JP | 2014162801 A | 9/2014 |
| JP | 2017095566 A | 6/2017 |
| WO | 2014115637 A1 | 7/2014 |

OTHER PUBLICATIONS

English machine translation of Ichiroku (JP 2012-255061) (Year: 2012).*
Singapore Search Report and Written Opinion for Application No. 11201810798P, dated Feb. 11, 2020, 7 pages.
International Search Report and Written Opinion for International Application No. PCT/JP2017/025885, dated Aug. 22, 2017—7 pages.
Extended European Search Report for European Application No. 17 839 152.0, dated Mar. 19, 2020, 5 pages.

* cited by examiner

*Primary Examiner* — Michael F Pepitone
(74) *Attorney, Agent, or Firm* — Ratnerprestia

(57) ABSTRACT

A resin composition including: (A) a polyimide resin containing 60 mol % or more of a diamine residue having a structure represented by General Formula (1) below in all diamine residues; (B) a thermosetting resin; and (C) a thermally conductive filler, wherein the resin composition contains 60 parts by volume or more of the thermally conductive filler (C) in 100 parts by volume of a total of the polyimide resin (A), the thermosetting resin (B), and the thermally conductive filler (C). Provided is a resin composition capable of providing a sheet that is excellent in heat resistance and thermal conductivity, has a low elastic modulus, and is excellent in thermal responsiveness.

[Chemical Formula 1]

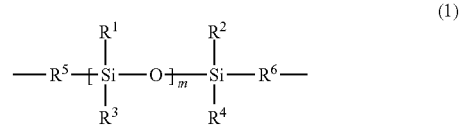

(1)

12 Claims, No Drawings

RESIN COMPOSITION, AND SHEET, LAMINATE, POWER SEMICONDUCTOR DEVICE, AND PLASMA PROCESSING APPARATUS INCLUDING THE SAME, AND METHOD OF PRODUCING SEMICONDUCTOR USING THE SAME

CROSS REFERENCE TO RELATED APPLICATIONS

This is the U.S. National Phase application of PCT/JP2017/025885, filed Jul. 18, 2017, which claims priority to Japanese Patent Application No. 2016-155236, filed Aug. 8, 2016, the disclosures of these applications being incorporated herein by reference in their entireties for all purposes.

FIELD OF THE INVENTION

The present invention relates to a resin composition containing a polyimide resin, a thermosetting resin, and a thermally conductive filler, and a sheet, a laminate, a power semiconductor device, and a plasma processing apparatus including the resin composition, and a method of producing a semiconductor using the resin composition.

BACKGROUND OF THE INVENTION

In a semiconductor producing step, a plasma processing apparatus having a mounting table for placing a wafer in a vacuum chamber is used to perform plasma processing to a semiconductor wafer. In recent years, the diameter of a semiconductor wafer has become large and the requirement for processing accuracy has become higher. Thus, to uniformly perform plasma processing to the wafer, it is necessary to make the temperature distribution uniform. Therefore, it is considered to place a heater on the outer periphery of the mounting table and place a focus ring thereon with a thermally conductive sheet interposed therebetween to heat the wafer.

To transfer the heat generated from a semiconductor module such as a power semiconductor to a heat sink and efficiently dissipate the heat, it is also considered to place a thermally conductive sheet that reduces the contact thermal resistance between the semiconductor module and the heat sink.

As a film adhesive having a high thermal conductivity, a highly thermally conductive film adhesive composed of polyimide siloxane and a filler having a thermal conductivity of 5.0 W/(m·K) or more is proposed (see, for example, Patent Document 1). As a composition having excellent heat dissipation properties, a composition containing an epoxy resin, a curing agent, and an inorganic filler is proposed (see, for example, Patent Document 2). As a heat dissipation member having excellent heat dissipation properties, a heat dissipation member obtained by curing a resin composition containing a polyorganosiloxane and an inorganic filler on a member is proposed (see, for example, Patent Document 3).

PATENT DOCUMENTS

Patent Document 1: Japanese Patent Laid-open Publication No. 5-117621
Patent Document 2: Japanese Patent Laid-open Publication No. 2008-266378
Patent Document 3: Japanese Patent Laid-open Publication No. 2011-151280

SUMMARY OF THE INVENTION

Froth the viewpoint of lowering the thermal resistance at the contact interface between the heater and the focus ring and at the contact interface between the semiconductor module and the heat sink, these thermally conductive sheets are required to have a low elastic modulus so that they can adhere to the base material according to the shape of the base material in contact with the sheets. In addition, the thermally conductive sheets are required to have heat resistance of 250° C. or more because the surface temperature of the focus ring during plasma processing reaches 250° C. or more and the operating temperature reaches 250° C. or more due to the shift of the material of the element of the power semiconductor from Si to SiC, which achieves less energy loss.

However, when the compositions described in Patent Documents 1 and 2 are applied to a thermally conductive sheet, the sheet has insufficient adhesiveness to a base material due to a high elastic modulus, and has a problem in thermal responsiveness. Meanwhile, the composition described in Patent Document 3 has a problem of insufficient heat resistance.

Therefore, it is an object of the present invention to provide a resin composition capable of providing a sheet that is excellent in heat resistance and thermal conductivity, has a low elastic modulus, and is excellent in thermal responsiveness.

The present invention is a resin composition including (A) a polyimide resin containing 60 mol % or more of a diamine residue having a structure represented by General Formula (1) below in all diamine residues; (B) a thermosetting resin; and (C) a thermally conductive filler, wherein the resin composition contains 60 parts by volume or more of the thermally conductive filler (C) in 100 parts by volume of a total of the polyimide resin (A), the thermosetting resin (B), and the thermally conductive filler (C).

[Chemical Formula 1]

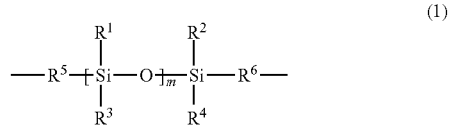

In General Formula (1), $R^1$ to $R^4$ may each be same or different and represent an alkyl, group having 1 to 30 carbon atoms, a phenyl group, or a phenoxy group. The phenyl group and the phenoxy group may be substituted with an alkyl group having 1 to 30 carbon atoms. m $R^1$s and $R^3$s may each be same or different. $R^5$ and $R^6$ may each be same or different and represent an alkylene group having 1 to 30 carbon atoms or an arylene group. The arylene group may be substituted with an alkyl group having 1 to 30 carbon atoms. m represents a range of 10 or more.

The present invention includes a power semiconductor device including a heat sink; and a power semiconductor module, wherein a sheet including a cured product of the resin composition is provided between the heat sink and the power semiconductor module.

The present invention includes a sheet including a cured product of the resin composition.

The present invention includes a laminate including a base material selected from a metal substrate and a ceramic substrate; and the sheet laminated on the base material.

The present invention includes a laminate including a heating element; and the sheet laminated on the heating element.

The present invention includes a plasma processing apparatus including a plasma source; a mounting table having a temperature regulation mechanism; and a temperature control plate, wherein the sheet is provided between the mounting table having a temperature regulation mechanism and the temperature control plate.

The present invention includes a method of producing a semiconductor including the step of performing dry etching using the plasma processing apparatus.

The resin composition of the present invention provides a sheet that is excellent in heat resistance and thermal conductivity, has a low elastic modulus, and is excellent in thermal responsiveness.

DETAILED DESCRIPTION OF EMBODIMENTS OF THE INVENTION

The resin composition of the present invention contains (A) a polyimide resin containing 60 mol % or more of a diamine residue having a structure represented by General Formula (1) below in all diamine residues (hereinafter may be referred to as "(A) a polyimide resin"); (B) a thermosetting resin; and (C) a thermally conductive filler.

[Chemical Formula 2]

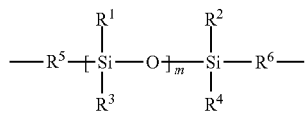
(1)

In General Formula (1), $R^1$ to $R^4$ may each be same or different and represent an alkyl group having 1 to 30 carbon atoms, a phenyl group, or a phenoxy group. The phenyl group and the phenoxy group may be substituted with an alkyl group having 1 to 30 carbon atoms. m $R^1$s and $R^3$s may each be same or different. $R^5$ and $R^6$ may each be same or different and represent an alkylene group having 1 to 30 carbon atoms or an arylene group. The arylene group may be substituted with an alkyl group having 1 to 30 carbon atoms. m represents a range of 10 or more.

The polyimide resin is generally obtained mainly by reacting a tetracarboxylic dianhydride and a diamine, and has a tetracarboxylic dianhydride residue and a diamine residue. The polyimide resin (A) contains 60 mol % or more of a diamine residue having a structure represented by General Formula (1) below in all diamine residues. By including a polyimide resin (A) having a highly flexible siloxane skeleton, the sheet including a cured product of the resin composition of the present invention (hereinafter also referred to as a thermally conductive sheet) has a reduced elastic modulus, thus a thermally conductive sheet that has excellent adhesiveness, follows the shape of the base material can be obtained, and has greatly improved thermal responsiveness can be obtained. When the content of the diamine residue having a structure represented by General Formula (1) below is less than 60 mol %, the elastic modulus of the thermally conductive sheet is increased and the thermal responsiveness is lowered. From the viewpoint of further reducing the elastic modulus and further improving the thermal responsiveness, the polyimide resin preferably contains 70 mol % or more, and more preferably contains 85 mol % or more of the diamine residue having a structure represented by General Formula (1) below in all diamine residues. Meanwhile, from the viewpoint of improving the compatibility with thermosetting resin (B), the polyimide resin preferably contains 99 mol % or less, and more preferably contains 95 mol % or less of the diamine residue having a structure represented by General Formula (1) below in all diamine residues.

[Chemical Formula 3]

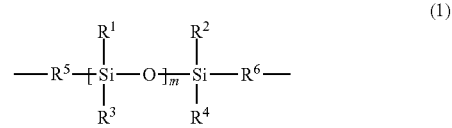
(1)

In General Formula (1), $R^1$ to $R^4$ may each be same or different and represent an alkyl group having 1 to 30 carbon atoms, a phenyl group, or a phenoxy group. The phenyl group and the phenoxy group may be substituted with an alkyl group having 1 to 30 carbon atoms, and the alkyl group may be linear or branched. Examples of the alkyl group having 1 to 30 carbon atoms include a methyl group, an ethyl group, a propyl group, and a butyl group. From the viewpoint of further improving the heat resistance, the carbon number of the alkyl group is preferably 12 or less. m $R^1$s and $R^3$s may each be same or different.

In General Formula (1), $R^5$ and $R^6$ may each be same or different and represent an alkylene group having 1 to 30 carbon atoms or an arylene group. The arylene group may be substituted with an alkyl group having 1 to 30 carbon atoms, and both the alkylene group and the alkyl group may be linear or branched. Examples of the alkylene group having 1 to 30 carbon atoms include a methylene group, an ethylene group, a propylene group, and a butylene group. From the viewpoint of further improving the heat resistance, the carbon number of the arylene group is preferably 12 or less. Examples of the arylene group include a phenylene group. The alkylene group and the arylene group may be bonded.

In General Formula (1), m represents a range of 10 or more. Although m is an integer in each polymer chain, the average obtained by the measurement of the whole polyimide resin may not be an integer. By setting m to 10 or more, the long and flexible siloxane chain can reduce the elastic modulus of the thermally conductive sheet and improve the thermal conductivity. When m is less than 10, the elastic modulus of the thermally conductive sheet is increased and the thermal responsiveness is lowered. From the viewpoint of further lowering the elastic modulus of the thermally conductive sheet, m is preferably 12 or more. Meanwhile, from the viewpoint of improving the compatibility with the thermosetting resin (B), m is preferably 40 or less.

The weight average molecular weight of the polyimide resin (A) is preferably 1000 or more, more preferably 10000 or more. By setting the weight average molecular weight to 1000 or more, the toughness of the thermally conductive sheet can be improved, the elastic modulus can be reduced, and the thermal responsiveness can be further improved. Meanwhile, the weight average molecular weight of the polyimide resin (A) is preferably 1,000,000 or less, more preferably 200,000 or less. By setting the weight average molecular weight to 1,000,000 or less, the dispersibility of the thermally conductive filler (C) can be improved, and the thermal conductivity can be further improved.

The weight average molecular weight of the polyimide resin (A) can be calculated in terms of polystyrene by subjecting a solution having a resin concentration of 0.1% by weight obtained by dissolving the polyimide resin (A) in N-methyl-2-pyrrolidone to gel permeation chromatography (GPC) analysis.

The polyimide resin (A) is preferably solvent-soluble. When the polyimide resin is solvent-soluble, the viscosity during preparation of the resin composition can be lowered, and the dispersibility of the thermally conductive filler (C) can be further improved. "The polyimide resin (A) is solvent-soluble" means that 1 g or more of the polyimide resin (A) can be dissolved at 25° C. in 100 g of any organic solvent selected from amide solvents such as N-methyl-2-pyrrolidone, N, N-dimethylacetamide, N, N-dimethylformamide, N-vinylpyrrolidone, and N, N-diethylformamide; γ-butyrolactone; and ether solvents such as monoglyme, diglyme, triglyme, methyl monoglyme, methyl diglyme, methyl triglyme, ethyl monoglyme, ethyl diglyme, ethylene glycol monomethyl ether, ethylene glycol monoethyl ether, propylene glycol monomethyl ether, propylene glycol monoethyl ether, ethylene glycol dimethyl ether, and ethylene glycol diethyl ether.

Examples of the diamine preferably used as the raw material of the polyimide resin (A) having a diamine residue represented by General Formula (1) above include a compound having a structure represented by any one of General Formulas (2) to (10) below. Examples of commercially available diamines having such a structure include X-22-161A, X-22-161B, KF8012, KF8008, and X-22-1660B-3 manufactured by Shin-Etsu Chemical Co., Ltd., Two or more types of these may be used.

[Chemical Formula 4]

(2)

$H_2NH_2CH_2CH_2C-(Si(CH_3)_2-O)_m-Si(CH_3)_2-CH_2CH_2CH_2NH_2$ (3)

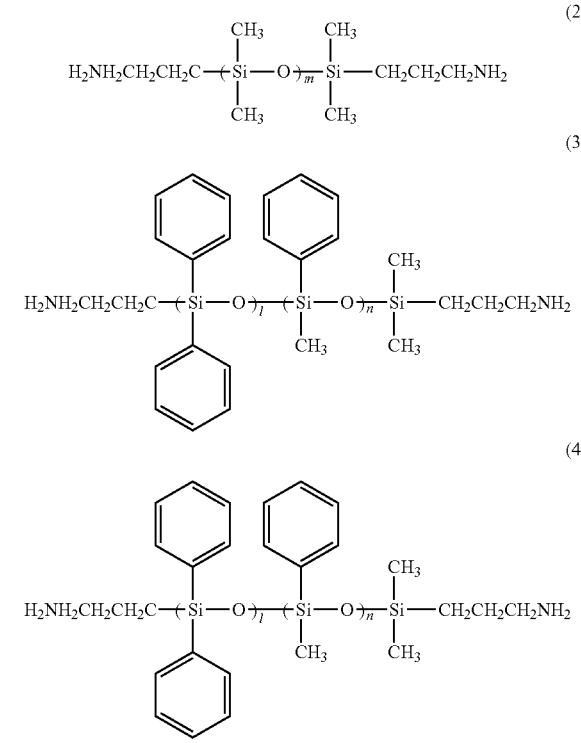

(4)

[Chemical Formula 5]

(5)

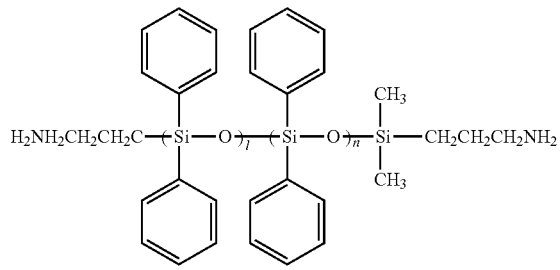

(6)

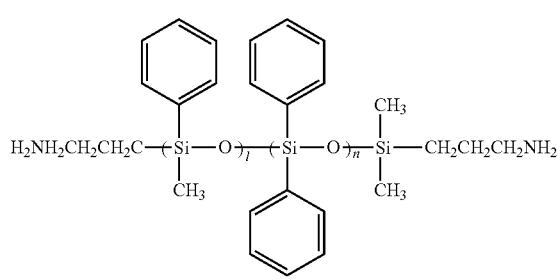

(7)

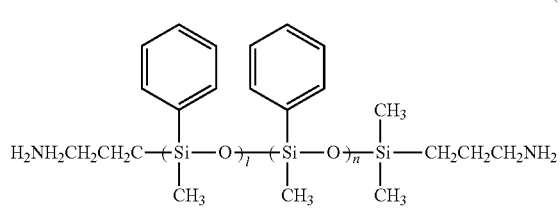

[Chemical Formula 6]

(8)

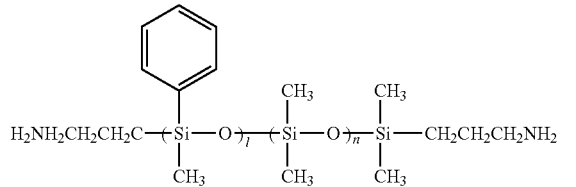

(9)

(10)

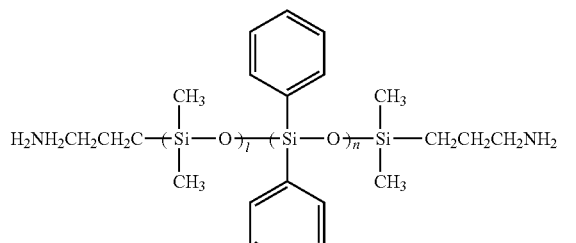

In General Formulas (2) to (10), m represents an integer of 10 or more. Both l and n represent an integer, and l+n is 10 or more. As described above, although m is an integer in each polymer chain, the average obtained by the measurement of the whole polyimide resin may not be an integer. The same applies to l+n.

The diamine residue that constitutes the polyimide resin (A) preferably has a hydroxyl group and/or a carboxyl group. When the polyimide resin has a diamine residue having a hydroxyl group or a carboxyl group, the reaction with the thermosetting resin (B) is promoted and the toughness of the thermally conductive sheet can be improved. The diamine residue more preferably has a carboxyl group because the carboxyl group has higher acidity, thus improves the dispersibility of the thermally conductive filler (C) and further improves the thermal conductivity. From the viewpoint of improving the toughness of the thermally conductive sheet, the polyimide resin preferably has 1 mol % or more of a diamine residue having a hydroxyl group and/or a carboxyl group in all diamine residues. Meanwhile, from the viewpoint of further reducing the elastic modulus of the thermally conductive sheet and further improving the thermal responsiveness, the polyimide resin preferably has 40 mol % or less, more preferably has 30 mol % or less of a diamine residue having a hydroxyl group and/or a carboxyl group in all diamine residues.

Examples of the diamine residue having a hydroxyl group and/or a carboxyl group include a residue having a structure below.

[Chemical Formula 7]

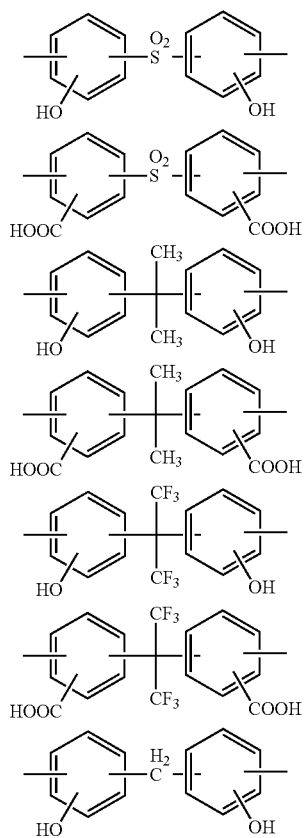

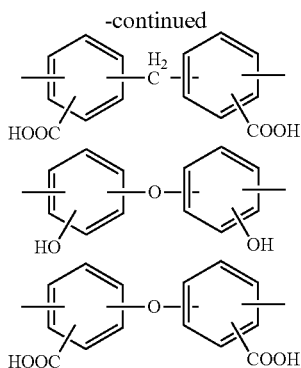

[Chemical Formula 8]

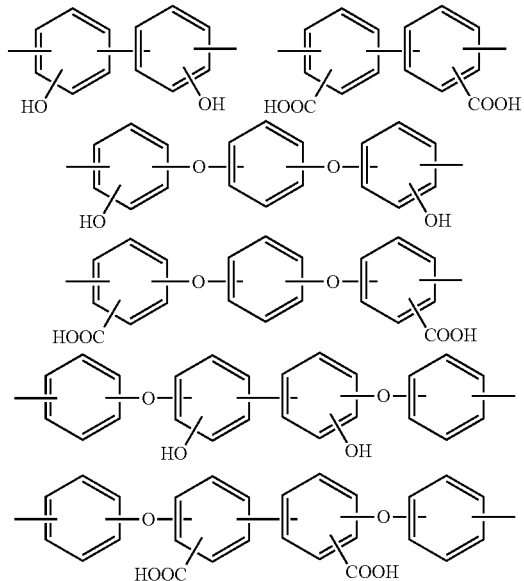

[Chemical Formula 9]

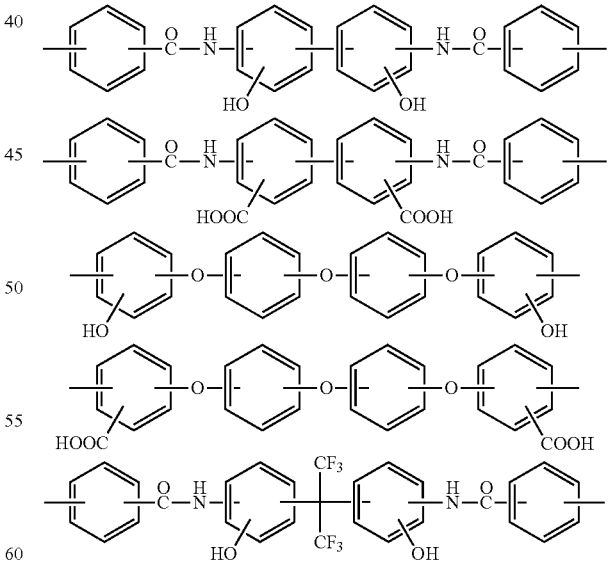

The polyimide resin (A) may have other diamine residues in addition to the above diamine residues as long as the effect of the present invention is not impaired. Examples of other diamine residues include residues of diamine compounds such as diamines containing one benzene ring such as 1,4-diaminobenzene, 1,3-diaminobenzene, 2,4-diaminotoluene, and 1,4-diamino-2,5-dihalogenobenzene; diamines containing two benzene rings such as bis(4-aminophenyl) ether, bis(3-aminophenyl) ether, bis(4-aminophenyl) sulfone, bis(3-aminophenyl) sulfone, bis(4-aminophenyl) methane, bis(3-aminophenyl) methane, bis(4-aminophenyl) sulfide, bis(3-aminophenyl) sulfide, 2,2-bis(4-aminophenyl) propane, 2,2-bis(3-aminophenyl) propane, 2,2-bis(4-aminophenyl) hexafluoropropane, o-dianisidine, o-tolidine, and tolsine sulfonic acids; diamines containing three benzene rings such as 1,4-bis(4-aminophenoxy) benzene, 1,4-bis(3-aminophenoxy) benzene, 1,4-bis(4-aminophenyl) benzene, 1,4-bis(3-aminophenyl) benzene, $\alpha,\alpha'$-bis(4-aminophenyl)-1,4-diisopropylbenzene, and $\alpha,\alpha'$-bis(4-aminophenyl)-1,3-diisopropylbenzene; diamines containing four or more benzene rings such as 2,2-bis [4-(4-aminophenoxy) phenyl] propane, 2,2-bis [4-(4-aminophenoxy) phenyl] hexafluoropropane, 2,2-bis [4-(4-aminophenoxy) phenyl] sulfone, 4,4'-(4-aminophenoxy) biphenyl, 9,9-bis(4-aminophenyl) fluorene, and 5,10-bis(4-aminophenyl) anthracene. The polyimide resin may have two or more types of these.

Examples of the tetracarboxylic dianhydride residue that constitutes the polyimide resin (A) include acid dianhydride residues such as pyromellitic anhydride (PMDA), oxydiphthalic dianhydride (ODPA), 3,3',4,4'-benzophenonetetracarboxylic dianhydride (BTDA), 3,3',4,4'-biphenyltetracarboxylic dianhydride (BPDA), 3,3',4,4'-diphenylsulfone tetracarboxylic dianhydride (DSDA), 2,2'-bis [(dicarboxyphenoxy) phenyl] propane dianhydride (BSAA), 4,4'-hexafluoroisopropylidene diphthalic anhydride (6FDA), and 1,2-ethylenebis(anhydrotrimellitate) (TMEG). The polyimide resin may have two or more types of these.

The polyimide resin (A) preferably has an acid anhydride residue having a hexafluoroisopropylidene skeleton. Since the hexafluoroisopropylidene skeleton is a bulky skeleton, it can suppress the aggregation of the polyimide resin structure and further reduce the elastic modulus of the thermally conductive sheet. From the viewpoint of further reducing the elastic modulus of the thermally conductive sheet and further improving the thermal responsiveness, the polyimide resin preferably contains 10 mol % or more of an acid anhydride residue having a hexafluoroisopropylidene skeleton in all acid anhydride residues. Examples of the acid anhydride residue having an acid anhydride residue having a hexafluoroisopropylidene skeleton include 4,4'-hexafluoroisopropylidene diphthalic anhydride (6FDA).

The tetracarboxylic dianhydride residue and the diamine residue preferably have a structure selected from 1) a structure having small number of benzene rings, 2) a structure having a large molecular weight and bulkiness, and 3) a structure having a large number of bent portions such as ether bonds. When the tetracarboxylic dianhydride residue and the diamine residue have such a structure, the interaction between molecular chains is reduced and the solvent solubility of the polyimide resin (A) can be improved.

The polyimide resin (A) may be composed of only a polyimide structural unit, or may be a copolymer having other structures as a copolymerization component in addition to the polyimide structural unit as long as the effect of the present invention is not impaired. The polyimide resin (A) may also contain a precursor (a polyamic acid structure) of the polyimide structural unit. The polyimide resin (A) may contain two or more types of these.

The polyimide resin (A) can be synthesized by a known method using a diamine and a tetracarboxylic dianhydride. Examples of the method include a method of obtaining a polyimide resin precursor and imidizing it. Examples of the method of synthesizing the polyimide resin precursor include a method in which a tetracarboxylic dianhydride and a diamine compound (a part of which may be substituted to be an aniline derivative) are reacted at low temperature, a method in which a tetracarboxylic dianhydride and an alcohol are reacted to obtain a diester, and then the diester is reacted with a diamine (a part of which may be substituted to be an aniline derivative) in the presence of a condensing agent, and a method in which a tetracarboxylic dianhydride and an alcohol are reacted to obtain a diester, then the remaining two carboxyl groups are converted into an acid chloride, and the resulting product is further reacted with a diamine (a part of which may be substituted to be an aniline derivative).

The resin composition of the present invention contains the thermosetting resin (B). When the resin composition of the present invention contains the thermosetting resin (B), the crosslinking reaction of the polyimide resin (A) is promoted, and the toughness and heat resistance of the thermally conductive sheet can be improved.

The thermosetting resin (B) preferably has a group selected from an epoxy group, an isocyanate group, and a methylol group. In particular, from the viewpoint of excellent heat resistance and curing reactivity, the thermosetting resin (B) preferably has a group selected from an epoxy group and a methylol group As the thermosetting resin (B) having an epoxy group, epoxy resins below can be preferably used.

An example of the preferred epoxy resin is an epoxy resin having a siloxane skeleton from the viewpoint of further reducing the elastic modulus of the thermally conductive sheet and further improving the thermal responsiveness. Examples of such an epoxy resin include X-40-2695B and X-22-2046 manufactured by Shin-Etsu Chemical Co., Ltd.

Another example of the preferred epoxy resin is an epoxy resin containing a triazine skeleton from the viewpoint of increasing the heat resistance at a high temperature of 200° C. or more and preventing the thermally conductive sheet from weakening after long-time use at a temperature of 200° C. or more to increase releasability. Examples of such an epoxy resins include TEPIC (registered trademark)-PAS B26 L, TEPIC (registered trademark)-PAS B22, TEPIC (registered trademark)-S, TEPIC (registered trademark)-VL, TEPIC (registered trademark)-FL, and TEPIC (registered trademark)-UC manufactured by Nissan Chemical Corporation.

Another example of the preferred epoxy resin is an epoxy resin having a biphenyl group, a naphthalene skeleton, an anthracene skeleton, a phenyl benzoate group, and a mesogenic skeleton such as a benzanilide group from the viewpoint of improving the structural regularity of the thermally conductive sheet and further improving the thermal conductivity. Examples of such an epoxy resin include jER (registered trademark) YX4000, jER (registered trademark) YX4000H, jER (registered trademark) YX8800, jER (registered trademark) YL6121H, jER (registered trademark) YL6640, jER (registered trademark) YL6677, and jER (registered trademark) YX7399 manufactured by Mitsubishi Chemical Corporation; NC3000, NC3000H, NC3000L, and CER-3000L manufactured by Nippon Kayaku Co., Ltd.; YSLV-80XY and YDC1312 manufactured by Nippon Steel Chemical Co., Ltd.; and HP4032, HP4032D, and HP4700 manufactured by DIC CORPORATION.

Another example of the preferred epoxy resin is an epoxy resin having a fluorene skeleton from the viewpoint of improving the dispersibility of the thermally conductive filler (C) and further improving the thermal conductivity.

Examples of such an epoxy resin include PG100, CG500, CG300-M2, EG200, and EG250 manufactured by Osaka Gas Chemicals Co., Ltd.

A liquid epoxy resin is preferred from the viewpoint of reducing the viscosity at the time of dispersing the thermally conductive filler (C). The term "liquid epoxy resin" herein refers to an epoxy resin having a viscosity of 150 Pa·s or less at 25° C. and $1.013 \times 10^5$ N/m². Examples of such an epoxy resin include a bisphenol A epoxy resin, a bisphenol F epoxy resin, an alkylene oxide modified epoxy resin, and a glycidyl amine epoxy resin. More specifically, examples of such an epoxy resin include jER (registered trademark) 827, jER (registered trademark) 828, jER (registered trademark) 806, jER (registered trademark) 807, jER (registered trademark) 801N, jER (registered trademark) 802, jER (registered trademark) 604, jER (registered trademark) 630, and jER (registered trademark) 630LSD manufactured by Mitsubishi Chemical Corporation; "EPICLON" (registered trademark) 840S, "EPICLON" (registered trademark) 850S, "EPICLON" (registered trademark) 830S, "EPICLON" (registered trademark) 705, and "EPICLON" (registered trademark) 707 manufactured by DIC CORPORATION; YD127, YD128, PG207N, and PG202 manufactured by Nippon Steel Chemical Co., Ltd.; and "TEPIC" (registered trademark)-PASB26L, "TEPIC" (registered trademark)-PASB22, "TEPIC" (registered trademark)-VL, "TEPIC" (registered trademark)-FL, and TEPIC (registered trademark)-UC manufactured by Nissan Chemical Industries, Ltd.

Examples of the thermosetting resin (B) having an isocyanate group include aromatic polyisocyanates such as 4,4'-methylenebis(phenylene isocyanate) (MDI) and tolylene diisocyanate (TDI); aliphatic polyisocyanates such as hexamethylene diisocyanate (HDI), trimethylene diisocyanate, 1,4-tetramethylene diisocyanate, pentamethylene diisocyanate, and lysine diisocyanate; and alicyclic polyisocyanates such as isophorone diisocyanate (IPDI), and 4,4'-methylenebis(cyclohexylisocyanate) (H12MDI). Among these, aromatic polyisocyanates are preferred from the viewpoint of further improving the heat resistance.

The thermosetting resin (B) having an isocyanate group is preferably a blocked isocyanate blocked by a block such as oxime, lactam, and pyrazole. Such a thermosetting resin can improve workability and provide easy adjustment of the crosslinking temperature.

Examples of the thermosetting resin (B) having a methylol group include dimethylol benzene, dimethylol acetanilide, methyl dimethyl benzoate, hydroxymethyl benzene dimethylol, bis [(hydroxy-hydroxymethyl-dimethylphenyl) methyl] cyclohexylphenol, (tetrahydroxymethyl) benzenediol, methylenebis [bis(hydroxymethyl) phenol], methylene bis [methyl-hydroxymethyl phenol], alkylated melamine methylol compounds such as NIKALAC MW-30HM, MW-100HM, and MX-750LM manufactured by Sanwa Chemical Co., Ltd., and alkylated urea methylol compounds such as NIKALAC MX-270, MX-280, and MX-290 manufactured by Sanwa Chemical Co., Ltd.

The resin composition may contain two or more types of the thermosetting resin (B).

The content of the thermosetting resin (B) in the resin composition of the present invention is preferably 0.1 parts by weight or more relative to 100 parts by weight of the polyimide resin (A) from the viewpoint of further improving the toughness and heat resistance of the thermally conductive sheet. Meanwhile, the content is preferably 15 parts by weight or less from the viewpoint of further reducing the elastic modulus of the thermally conductive sheet.

The resin composition of the present invention contains the thermally conductive filler (C). By including the thermally conductive filler (C), the thermal conductivity and the thermal responsiveness of the thermally conductive sheet can be improved. In the present invention, the thermally conductive filler refers to a filler having a thermal conductivity of 2 W/m·K or more at 25° C. From the viewpoint of further improving the thermal conductivity of the thermally conductive sheet, the thermal conductivity of the thermally conductive filler is preferably 10 W/m·K or more.

The thermal conductivity of the filler can be determined by measuring a sintered body having a thickness of about 1 mm and a porosity of 10% or less made from the filler according to JIS R1611 (2010). According to JIS R1634 (1998), "c) bulk density" in "7.2 Measurement method" of JIS R1611 (2010) can be obtained.

Examples of the thermally conductive filler (C) include a filler made of carbon black, silica, magnesium oxide, zinc oxide, alumina, aluminum nitride, boron nitride, silicon carbide, silicon nitride or the like; and a metal filler made of copper, aluminum, magnesium, silver, zinc, iron, lead or the like. The resin composition may contain two or more types of these. Among these, a filler made of silica, magnesium oxide, zinc oxide, alumina, aluminum nitride, boron nitride or the like is preferred because of the higher thermal conductivity. Aluminum nitride particles are more preferred because they have insulating properties and high thermal conductivity of about 170 W/m·K. Examples of the aluminum nitride particles include FAN-f10, FAN-f30, FAN-f50, and FAN-f80 manufactured by Furukawa Denshi Co., Ltd., and M30, M50, and M80 manufactured by MARUWA Co., Ltd.

Examples of the shape of the thermally conductive filler (C) include a perfect spherical shape, a spherical shape, a scaly shape, a flake shape, a foil piece shape, a fibrous shape, and a needle shape. From the viewpoint of including the thermally conductive filler (C) at a high density, the perfect spherical shape is preferred.

The thermally conductive filler (C) preferably at least has each frequency maximum peak in (C-1) a region of a particle size of 1.5 μm or less and in (C-2) a region of a particle size of 2 μm or more in a frequency distribution (based on the number) of the particle size. By having the frequency maximum peak in the region (C-1), the thermally conductive filler (C) can be close-packed in the resin composition, and the thermal conductivity can be further improved. The frequency maximum peak in the region (C-1) is more preferably in a region of a particle size of 1 μm or less. Meanwhile, from the viewpoint of improving the dispersibility of the thermally conductive filler (C), the frequency maximum peak of the (C-1) region is preferably in a region of a particle size of 0.001 μm or more. By having the frequency maximum peak in the region of a particle size of 2 μm or more (C-2), the thermally conductive filler (C) has the reduced interface with the polyimide resin (A) and the thermosetting resin (B), and the thermal conductivity of the thermally conductive sheet can be further improved. The frequency maximum peak in the region (C-2) is more preferably in a region of a particle size of 2.5 μm or more. Meanwhile, from the viewpoint of improving the surface smoothness of the thermally conductive sheet, the frequency maximum peak of the region (C-2) is preferably in a region of a particle size of 100 μm or less.

The particle size distribution of the thermally conductive filler (C) can be determined by a laser diffraction and/or scattering method. Examples of measuring instruments include SLD3100 manufactured by Shimadzu Corporation and LA920 manufactured by HORIBA, Ltd.

Examples of the method of obtaining the frequency distribution of the particle size of the thermally conductive filler (C) of the above range include a method of incorporating a thermally conductive filler having an average particle size of 1.5 µm or less and a thermally conductive filler having an average particle size of 2 µm or more. In this case, from the viewpoint of further improving the thermal conductivity, the incorporated amount of the thermally conductive filler having an average particle size of 2 µm or more is preferably 40% by volume or more, more preferably 50% by volume or more in the entire thermally conductive filler (C). From the viewpoint of close-packing the thermally conductive filler (C) to further improve the thermal conductivity, the incorporated amount of the thermally conductive filler having an average particle size of 2 µm or more is preferably 80% by volume or less, more preferably 70% by volume or less in the entire thermally conductive filler (C).

The particle size in the present invention herein refers to the particle size of primary particles not aggregated. The average particle size of the thermally conductive filler (C) incorporated in the resin composition can be determined for example by observing the particles under the condition of a magnification of 5000 times with SEM (scanning electron microscope) or TEM (transmission electron microscope), measuring the particle sizes of 200 particles selected randomly, and calculating the number average. When the cross section in the observed image is circular, the diameter of the circle is taken as the particle size, and when the cross section in the observed image is not circular, the longest diagonal passing through the center of the observed cross section is taken as the particle size.

The content of the thermally conductive filler (C) in the resin composition of the present invention is 60 parts by volume or more based on 100 parts by volume of the total of the components (A) to (C). When the content of the thermally conductive filler (C) is less than 60 parts by volume, the thermal conductivity is lowered. Meanwhile, from the viewpoint of further reducing the elastic modulus of the thermally conductive sheet, the content of the thermally conductive filler (C) is preferably 90 parts by volume or less, more preferably 80 parts by volume or less based on 100 parts by volume of the total of the components (A) to (C).

The content (parts by volume) of the thermally conductive filler (C) can be calculated from each content (based on weight) and each specific gravity of the polyimide resin (A), the thermosetting resin (B), and the thermally conductive filler (C).

When the resin composition is composed of the components (A) to (C) only, the content (parts by volume) of the thermally conductive filler (C) can also be calculated by thermogravimetric analysis. When the sheet including a cured product of the resin composition is heated to 600 to 900° C. to decompose and volatilize the resin component, only the thermally conductive filler (C) remains. In this way, the weight of the thermally conductive filler (C) contained in the resin composition is measured. The weight of the resin component (the component (A) and the component (B)) is calculated by subtracting the weight of the filler from the weight of the sheet. Thereafter, the volumes can be calculated by measuring the specific gravity of the filler and the resin component by the Archimedes method and dividing the previously obtained weights by the specific gravity.

The resin composition of the present invention may contain a curing agent as needed. When the thermosetting resin (B) has an epoxy group, curing of the thermosetting resin (B) is promoted by combining the curing agent, and the resin can be cured in a short time. Examples of the curing agent include imidazoles, polyhydric phenols, acid anhydrides, amines, hydrazides, polymercaptans, Lewis acid-amine complexes, and latent curing agents. The resin composition of the present invention may contain two or more types of these. Among these, curing agents selected from imidazoles, polyhydric phenols, and latent curing agents are preferred.

Examples of the imidazoles include "Curezol" (registered trademark) 2MZ, "Curezol" (registered trademark) 2PZ, "Curezol" (registered trademark) 2MZ-A, and "Curezol" (registered trademark) 2MZ-OK (trade names, manufactured by Shikoku Chemicals Corporation). Examples of the polyhydric phenols include "SUMILITERESIN" (registered trademark) PR-HF3 and "SUMILITERESIN" (registered trademark) PR-HF6 (trade names, manufactured by Sumitomo Bakelite Co., Ltd.); "KAYAHARD" (registered trademark) KTG-105 and "KAYAHARD" (registered trademark) NHN (trade names, manufactured by Nippon Kayaku Co., Ltd.); and "PHENOLITE" (registered trademark) TD2131, "PHENOLITE" (registered trademark) TD2090, "PHENOLITE" (registered trademark) VH-4150, "PHENOLITE" (registered trademark) KH-6021, "PHENOLITE" (registered trademark) KA-1160, and "PHENOLITE" (registered trademark) KA-1165 (trade names, manufactured by DIC Corporation). Examples of the latent curing agents include dicyandiamide latent curing agents, amine adduct latent curing agents, organic acid hydrazide latent curing agents, aromatic sulfonium salt latent curing agent's, microcapsule latent curing agents, and photocurable latent curing agents.

Examples of the dicyandiamide latent curing agents include DICY7, DICY15, and DICY50 (trade names, manufactured by Japan Epoxy Resins Co., Ltd.); and "AMICURE" (registered trademark) AH-154, and "AMICURE" (registered trademark) AH-162 (trade names, manufactured by Ajinomoto Fine-Techno Co., Inc.). Examples of the amine adduct latent curing agents include "AMICURE" (registered trademark) PN-23, "AMICURE" (registered trademark) PN-40, "AMICURE" (registered trademark) MY-24, "AMICURE" MY-H (trade names, manufactured by Ajinomoto Fine-Techno Co., Inc.; and Fujicure FXR-1030 (trade name, manufactured by FUJIKASEI CO., LTD.). Examples of the organic acid hydrazide latent curing agents include "AMICURE" (registered trademark) VDH and "AMICURE" (registered trademark) UDH (trade names, manufactured by Ajinomoto Fine-Techno Co., Inc.). Examples of the aromatic sulfonium salt latent curing agents include "SAN-AID" (registered trademark) SI100, "SAN-AID" (registered trademark) SI150, and "SAN-AID" (registered trademark) SI180 (trade names, manufactured by SANSHIN CHEMICAL INDUSTRY CO., LTD.). Examples of the microcapsule latent curing agents include those obtained by encapsulating each of the above curing agents with a vinyl compound, a urea compound, a thermoplastic resin or the like. Examples of the microcapsule latent curing agent obtained by treating the amine adduct latent curing agent with isocyanate include "Novacure" (registered trademark) HX-3941HP, "Novacure" (registered trademark) HXA3922HP, "Novacure" (registered trademark) HXA3932HP, and "Novacure" (registered trademark) HXA3042HP (trade names, manufactured by ASAHI KASEI CHEMICALS CORPORATION). Examples of the photocurable latent curing agents include "OPTOMER"

(registered trademark) SP and "OPTOMER" (registered trademark) CP (manufactured by ADEKA CORPORATION).

When the resin composition of the present invention contains a curing agent, its content is preferably 0.1 parts by weight or more and 35 parts by weight or less relative to 100 parts by weight of the thermosetting resin (B).

The resin composition of the present invention may contain a surfactant as needed. The surfactant can further improve the surface smoothness and adhesiveness to the base material of the thermally conductive sheet. The resin composition may also contain 0.5 to 10% by weight of silane coupling agents such as methyl methacryloxydimethoxysilane and 3-aminopropyltrimethoxysilane, and titanium chelating agents. The resin composition may also contain polyimide resins other than the polyimide resin (A). The content of other polyimide resins is preferably 100 parts by weight or less relative to 100 parts by weight of the polyimide resin (A).

The resin composition of the present invention may contain a solvent. As the solvent, one in which the above components can be dissolved may be selected appropriately, and examples of such a solvent include ketone solvents such as acetone, methyl ethyl, ketone, methyl isobutyl ketone, cyclopentanone, and cyclohexanone; ether solvents such as 1,4-dioxane, tetrahydrofuran, diglyme, and triglyme; glycol ether solvents such as methyl cellosolve, ethyl cellosolve, propylene glycol monomethyl ether, propylene glycol monoethyl ether, propylene glycol monobutyl ether, and diethylene glycol methyl ethyl ether; and benzyl alcohol, propanol, N-methylpyrrolidone, γ-butyrolactone, ethyl acetate, and N,N-dimethylformamide. In particular, a solvent having a boiling point of 120° C. or less under atmospheric pressure is preferred because such a solvent can be desolvated at a low temperature in a short time and thus sheet formation becomes easy when the resin composition is processed into a thermally conductive sheet below.

The resin composition of the present invention can be obtained by, for example, mixing the polyimide resin (A), the thermosetting resin (B), the thermally conductive filler (C), and other components contained as needed in a solvent. Examples of the mixing instrument include a propeller stirrer, a homogenizer, and a kneader. To further improve the dispersibility of the thermally conductive filler (C), the obtained mixture is preferably further mixed using a bead mill, a ball mill, a triple roll mill or the like.

Next, the sheet of the present invention will be described. The sheet of the present invention is a sheet including a cured product of the resin composition of the present invention (hereinafter referred to as a thermally conductive sheet). For example, the thermally conductive sheet can be obtained by applying the resin composition of the present invention onto a support and then curing the resin composition. In this case, a varnish-like resin composition containing a solvent may be applied and dried as the resin composition.

Examples of the support include a polyethylene terephthalate (PET) film, a polyphenylene sulfide film, and a polyimide film.

The facing surface of the support with the thermally conductive sheet may be subjected to a surface treatment with silicone, a silane coupling agent, an aluminum chelating agent, polyurea or the like to improve adhesiveness to the thermally conductive sheet and peelability.

The thickness of the support is preferably 10 to 200 μm from the viewpoint of workability.

Examples of the method of applying the resin composition onto the support include spin coating using a spinner, spray coating, roll coating, screen printing, and a coating method in which a blade coater, a die coater, a calender coater, a meniscus coater, a bar coater, a roll coater, a comma roll coater, a gravure coater, a screen coater, a slit die coater or the like is used.

Examples of the coating machine include a roll coater, a comma roll coater, a gravure coater, a screen coater, and a slit die coater. Among these, the slit die coater is preferred because it makes the volatilization of the solvent small during coating and provides stable coating.

Examples of the drier include an oven, a hot plate, and an infrared ray. The drying temperature and the drying time may be in any range within which the solvent can be volatilized, and the range is preferably appropriately set so that the sheet is in an uncured or semi-cured state (B stage state). Specifically, the drying temperature is preferably 40° C. to 120° C., and the drying time is preferably 1 minute to tens of minutes. The drying temperature may be raised stepwise. The sheet may be dried, for example, at 70° C., 80° C. and 90° C. for 1 minute each.

The dried sheet can be further heat-treated to obtain a cured product. After the completion of curing, the cured product can be peeled off from the support to obtain the thermally conductive sheet. The heating temperature is preferably 120° C. or more, more preferably 150° C. or more, further more preferably 180° C. or more. Meanwhile, the heating temperature is preferably 400° C. or less, more preferably 300° C. or less, further preferably 250° C. or less. The heating time is preferably 5 minutes to 5 hours. The heating temperature may be raised stepwise, or may be continuously raised within a certain temperature range selected. Examples of the heating method include a method of heat-treating the sheet at 130° C. and 200° C. for 30 minutes each and a method of linearly raising the temperature from room temperature to 250° C. over 2 hours. Examples of the heat treatment apparatus include an oven, a hot plate, and an infrared ray. When the curing temperature is higher than 180° C., the sheet is preferably cured under a nitrogen atmosphere or under vacuum.

The thermal conductivity of the thermally conductive sheet is preferably 1.0 W/m·K or more, more preferably 2.0 W/m·K or more. Examples of the method of obtaining such a range of the thermal conductivity include a method in which the resin composition of the present invention is used. In particular, the resin composition preferably contains the polyimide resin (A) having a diamine residue having a carboxyl group.

The thermal conductivity of the thermally conductive sheet can be calculated by measuring the thermal diffusivity by the flash method according to JIS R 1611 (2010), the specific heat by the DSC method, and the specific gravity by the Archimedes method, and multiplying the obtained thermal diffusivity value ($m^2/s$) by the obtained specific heat value (J/kg·K) and the obtained specific gravity value (kg/$m^3$). Examples of the thermal diffusivity measuring apparatus by the flash method include LFA447 manufactured by NETZSCH and LFA502 manufactured by KYOTO ELECTRONICS MANUFACTURING CO., LTD.

The elastic modulus of the thermally conductive sheet is preferably 50 MPa or less, more preferably 30 MPa or less from the viewpoint of reducing thermal resistance at the contact interface and further improving the thermal responsiveness. Examples of the method of obtaining such a range of the elastic modulus include a method in which the resin composition of the present invention is used. In particular, the resin composition preferably contains the polyimide resin containing 70 mol % or more, more preferably 85 mol % or more of a diamine residue having a structure represented by General Formula (1) above in all diamine residues, and has a content of the thermosetting resin (B) of 15 parts by weight or less relative to 100 parts by weight of the polyimide resin (A).

In the present invention, the elastic modulus of the thermally conductive sheet is the value of the storage elastic modulus at 25° C. that is obtained by dynamic viscoelasticity measurement. Dynamic viscoelasticity is measured according to JIS K 7244 (1998) at a tensile mode. Examples of the dynamic viscoelasticity measuring apparatus include DVA-200 manufactured by IT Measurement Control Co., Ltd. and Q800 manufactured by TA Instruments.

Though the thickness of the thermally conductive sheet is not particularly limited, it is preferably 100 µm or more and 400 µm or less from the viewpoint of handleability and adhesiveness to the base material. The thickness of the thermally conductive sheet can be measured with a contact type micrometer. When measuring the thickness of the thermally conductive sheet is difficult due to its strong tackiness, the thickness of the thermally conductive sheet can be measured by laminating a protective film such as a PET film on both sides of the thermally conductive sheet, measuring the total thickness, and then subtracting the thickness of the protective film.

The thermally conductive sheet may be exchanged entirely with a new sheet after being used and consumed continuously for a long time at a high temperature of 200° C. or more. Therefore, it is preferred that the thermally conductive sheet not only have high adhesiveness but also can be peeled off without being fixed to the base material after use. Specifically, the peel strength between the base material and the thermally conductive sheet after the base material and the thermally conductive sheet are bonded together and continuously heated at 250° C. for 10 hours is preferably 2 N/cm or less. The peel strength is more preferably 1 N/cm or less.

The peel strength of the thermally conductive sheet is measured by 90° peel test according to JIS Z 0237 (2009). Examples of the apparatus for conducting the 90° peeling test include Autograph AG-X manufactured by Shimadzu Corporation and Tensilon RTF manufactured by A&D Company, Limited.

A protective film may be further laminated on the surface of the thermally conductive sheet, thereby the surface of the thermally conductive sheet can be protected from contaminants such as dirt and dust in the atmosphere. Examples of the protective film include a polyethylene film, a polypropylene (PP) film, and a polyester film. The protective film preferably has a small adhesive force with the adhesive sheet.

The laminate of the present invention is a laminate including a base material and the thermally conductive sheet laminated on the base material. Examples of the base material include metal substrates such as copper or aluminum; substrates selected from ceramic substrates such as alumina and aluminum nitride; and those selected from members such as semiconductor elements and lead frame portions thereof.

Examples of the method of obtaining the laminate include a method in which a previously prepared thermally conductive sheet is laminated on a base material and a method in which the resin composition of the present invention is applied onto a base material to form the thermally conductive sheet.

Examples of the method of laminating the thermally conductive sheet on the base material include a method in which the thermally conductive sheet is laminated onto the base material and the resulting product is pressure-bonded. When a protective film is laminated on the thermally conductive sheet, the protective film on the side to be pressure-bonded is peeled off and then the thermally conductive sheet is laminated onto the base material. When the thermally conductive sheet is formed on a support, the support may be peeled off before bonding, or may be peeled off at any point in the pressure-bonding or after the pressure-bonding.

To improve the adhesiveness between the base material and the thermally conductive sheet, thermocompression-bonding may be performed. Examples of the method of thermocompression-bonding include a hot press treatment, a heat lamination treatment, and a thermal vacuum lamination treatment. The thermocompression-bonding temperature may be the glass transition temperature or more of the polyimide resin (A), and is preferably in the temperature range of room temperature to 400° C. The pressure during pressure-bonding is preferably in the range of 0.001 to 10 MPa. The pressure-bonding time is preferably 1 second to several minutes. From the viewpoint of appropriately suppressing the softening of the thermally conductive sheet during pressure-bonding and improving the workability, the pressure-bonding temperature is preferably 250° C. or less.

Examples of the method of forming the thermally conductive sheet by applying the resin composition onto a base material include a method in which a resin composition varnish is applied to one side of a base material to form a resin composition coating film, then dried, and further heat-treated. Examples of the coating method, the drying method, and the heat treatment method of the resin composition varnish include the method exemplified above as the method of producing the sheet of the present invention.

The laminate of the present invention may be further pressure-bonded to other substrates or members.

Examples of the laminate of the present invention include a laminate including a heating element and the thermally conductive sheet laminated on the heating element. Examples of the heating element include a semiconductor module including a heater substrate and a semiconductor element.

The laminate thus obtained can reduce the contact thermal resistance of the base material interface by the thermally conductive sheet and further improve the heat dissipation and the thermal responsiveness during heating.

Since the resin composition and the thermally conductive sheet of the present invention have high thermal conductivity and flexibility, they can be preferably used for heat dissipation materials for electronic components and electronic materials. More specifically, the resin composition and the thermally conductive sheet of the present invention can be preferably used as a thermally conductive sheet for a semiconductor device or a thermally conductive sheet for a plasma processing apparatus used in a semiconductor producing step.

The power semiconductor device of the present invention is a power semiconductor device including a heat sink and a power semiconductor module, wherein a sheet including a cured product of the resin composition of the present invention (a thermally conductive sheet) is provided between the heat sink and the power semiconductor module. The heat sink is generally composed of aluminum. Examples of the power semiconductor module include a power semiconductor module in which a power semiconductor element made of Si or SiC is mounted on a lead frame formed of copper and the periphery thereof is protected with mold resin. It is required to lower the contact thermal resistance at the interface between the power semiconductor module and the heat sink. In particular, with the recent improvement in packaging density of power semiconductor elements, the amount of heat generated during operation of the element has increased. Thus, a thermally conductive sheet having higher thermal conductivity is required to transfer the generated heat to a heat sink. For example, by bonding the thermally conductive sheet of the present invention onto a heat sink, the heat generated from the power semiconductor element can be efficiently transferred to the heat sink, thus the contact thermal resistance is reduced, and the thermal responsiveness can be improved. Examples of the method of bonding the thermally conductive sheet of the present invention onto a heat sink include a method in which a previously prepared thermally conductive sheet is bonded to a heat sink and a method in which the resin composition of the present invention is applied onto a heat sink to form the thermally conductive sheet. Further, the power semiconductor module is pressure-bonded or thermocompression-bonded onto the thermally conductive sheet.

The plasma processing apparatus of the present invention is a plasma processing apparatus including a plasma source, a mounting table having a temperature regulation mechanism, and a temperature control plate, wherein the thermally conductive sheet of the present invention is provided between the mounting table having a temperature regulation mechanism and the temperature control plate. The method of producing a semiconductor of the present invention is a method of producing a semiconductor including the step of performing dry etching using the plasma processing apparatus.

In the plasma processing apparatus, the dry etching step is performed on a substrate to be processed as follows: the substrate to be processed such as a semiconductor wafer is placed on a mounting table provided in a processing chamber, and a high frequency voltage is applied to the processing chamber under a vacuum environment to generate plasma. Since the processing accuracy required for the dry etching step has increased, to increase the uniformity of the plasma processing in the surface of the substrate to be processed, the temperature of the substrate to be processed is adjusted to be constant. Examples of the preferred aspect include an aspect in which a substrate having a temperature regulation mechanism is placed on the outer periphery of a substrate to be processed that is placed on a mounting table, and a temperature control plate placed on the top of the substrate having a temperature regulation mechanism controls the temperature. Examples of the substrate having a temperature regulation mechanism include a heater substrate composed of an insulating substrate such as alumina and aluminum nitride. Examples of the temperature control plate include a focus ring made of silicon or the like.

In this case, the heat from the substrate having a temperature regulation mechanism needs to be efficiently transferred to the temperature control plate. In the plasma processing apparatus of the present invention, the contact thermal resistance is reduced and the thermal responsiveness is improved by providing the sheet including a cured product of the resin composition of the present invention (the thermally conductive sheet) between the substrate having a temperature regulation mechanism and the temperature control plate.

Examples of the method of obtaining such a plasma processing apparatus include a method in which the thermally conductive sheet is laminated on the substrate having a temperature regulation mechanism, and then the temperature control plate is pressure-bonded or thermocompression-bonded onto the thermally conductive sheet. As a method of laminating the thermally conductive layer on the substrate having a temperature regulation mechanism, a method of bonding the thermally conductive sheet to the substrate having a temperature regulation mechanism or a method in which the resin composition of the present invention is applied to the substrate having a temperature regulation mechanism, dried, and heat-cured to form the thermally conductive sheet is preferred.

In this plasma processing apparatus, the temperature control plate is deteriorated by the plasma treatment, and thus is periodically exchanged as needed. At that time, the deteriorated temperature control plate is peeled from the substrate having a temperature regulation mechanism together with the thermally conductive sheet using a scraper or the like. Then, a new thermally conductive sheet and a temperature control plate are placed in the same manner. As described above, the thermally conductive sheet of the present invention is preferred because it can be peeled off without being fixed to a base material even after long continuous use at high temperatures.

EXAMPLES

The present invention will be specifically described below based on Examples, but the present invention is not limited thereto. The details of the raw materials indicated by abbreviations in each example are shown below.

<Raw Material of Polyimide>

BPDA: 3,3'-4,4'-biphenyltetracarboxylic dianhydride (manufactured by Mitsubishi Chemical Corporation)

ODPA: 4,4'-oxydiphthalic dianhydride (manufactured by Manac Incorporated)

6FDA: 4,4'-(hexafluoroisopropylidene) biphenyltetracarboxylic dianhydride (manufactured by DAIKIN INDUSTRIES, LTD.)

BAHF: 2,2-bis(3-amino-4-hydroxyphenyl) hexafluoroisopropylidene

MBAA: bis(4-amino-3-carboxyphenyl) methane

NJM-06: 1,3'-bis(4-amino-2-carboxyphenoxy) benzene (manufactured by Nipponjunryo Chemicals)

APB: 1,3-bis(3-aminophenoxy) benzene X-22-161A: diaminopolysiloxane (manufactured by Shin-Etsu Chemical Co., Ltd.) (average molecular weight: 1600, diaminopolysiloxane of Formula (1): m=19) ($R^1$ to $R^4$ are methyl groups, and $R^5$ and $R^6$ are trimethylene groups)

X-22-161B: diaminopolysiloxane (manufactured by Shin-Etsu Chemical Co., Ltd.) (average molecular weight: 3000, diaminopolysiloxane of Formula (1), m=37) ($R^1$ to $R^4$ are methyl groups, and $R^5$ and $R^6$ are trimethylene groups)

KF8010: diaminopolysiloxane (manufactured by Shin-Etsu Chemical Co., Ltd.) (average molecular weight: 860, diaminopolysiloxane of Formula (1), m=9). ($R^1$ to $R^4$ are methyl groups, and $R^5$ and $R^6$ are trimethylene groups).

<Thermosetting Resin>

X-40-2695B: a liquid epoxy resin having a siloxane skeleton (manufactured by Shin-Etsu Chemical Co., Ltd.)

JER630: a glycidyl amine liquid epoxy resin (manufactured by Mitsubishi Chemical Corporation)

HP4032: an epoxy resin having a naphthalene skeleton (manufactured by DIC CORPORATION)

TEPIC-PAS B22: a liquid epoxy resin having a triazine skeleton (manufactured by Nissan Chemical Corporation)

JER828: a bisphenol A liquid epoxy resin (manufactured by Mitsubishi Chemical Corporation)

NIKALAC MX270: an alkylated urea methylol compound.

<Thermally Conductive Filler>

FAN-10: aluminum nitride particles (average particle size: 10 μm, specific gravity: 3.3 g/cm$^3$, thermal conductivity: 170 W/m·K) (manufactured by Furukawa Denshi Co., Ltd.)

DAW-45: alumina particles (average particle size: 45 μm, specific gravity: 4.0 g/cm$^3$, thermal conductivity: 26 W/m·K) (manufactured by Denka Co., Ltd.)

AA18: alumina particles (average particle size: 18 μm, specific gravity: 4.0 g/cm$^3$, thermal conductivity: 20 W/m·K) (manufactured by Sumitomo Chemical Co., Ltd.)

AA3: alumina particles (average particle size: 3 μm, specific gravity: 4.0 g/cm$^3$, thermal conductivity: 20 W/m·K) (manufactured by Sumitomo Chemical Co., Ltd.)

AA07: alumina particles (average particle size: 0.7 μm, specific gravity: 4.0 g/cm$^3$, thermal conductivity: 20 W/m·K) (manufactured by Sumitomo Chemical Co., Ltd.: trademark name).

<Curing Agent>

2P4MZ: 2-phenyl-4-methylimidazole

<Solvent>

Triglyme: triethyleneglycol dimethylether

Evaluation methods in the Examples and Comparative Examples are described below.

<Weight Average Molecular Weight of Polyimide Resin>

A solution having a resin concentration of 0.1% by weight obtained by dissolving the polyimide resin obtained by the method described in each Example and Comparative Example in N-methyl-2-pyrrolidone (hereinafter referred to as NMP) was subjected to measurement as a measurement sample using GPC instrument Waters 2690 (manufactured by Waters Corporation) having the structure below to calculate the weight average molecular weight in terms of polystyrene. The GPC measurement conditions were as follows: a mobile phase was NMP in which LiCl and phosphoric acid were dissolved at concentrations of 0.05 mol/l each, and the development rate was 0.4 ml/min.

Detector: Waters 996
System controller: Waters 2690
Column oven: Waters HTR-B
Thermo controller: Waters TCM
Column: TOSOH guard column (placed to capture coarse particles mixed in the object to be measured and prevent clogging of the column)
Column: TOSOH TSK-GEL α-4000 (a column with an exclusion limit molecular weight of 1,000,000)
Column: TOSOH TSK-GEL α-2500 (a column with an exclusion limit molecular weight of 10,000)

These three columns were connected in series in this order.

<Imidization Rate of Polyimide Resin>

The infrared absorption spectrum of the polyimide resin obtained by the method described in each Example and Comparative Example was measured, and the presence of the absorption peaks of an imide structure (around 1780 cm$^{-1}$ and around 1377 cm$^{-1}$) was confirmed. Then, after heat-treating the polyimide resin at 350° C. for 1 hour, the infrared absorption spectrum was again measured, and the peak intensity around 1377 cm$^{-1}$ before and after the heat treatment were compared. The imidization rate of the polymer before the heat treatment was determined assuming that the imidization rate of the polyimide resin after the heat treatment is 100%.

<Average Particle Size of Thermally Conductive Filler>

The thermally conductive filler used in each Example and Comparative Example was observed with SEM (scanning electron microscope) under the condition of a magnification of 5000 times, the particle sizes of 200 particles selected randomly were measured, and the number average was calculated. When the cross section in the observed image was circular, the diameter of the circle was taken as the particle size, and when the cross section in the observed image was not circular, the longest diagonal passing through the center of the observed cross section was taken as the particle size.

<Content of Thermally Conductive Filler>.

The weight of each component used in each Example and Comparative Example was divided by the specific gravity to calculate the volume, and the content of the thermally conductive filler based on 100 parts by volume of the total of the polyimide resin, the thermosetting resin, and the thermally conductive filler was calculated.

<Thermal Conductivity>

The resin composition obtained in each Example and Comparative Example was applied on a PET film having a thickness of 38 μm using a comma roll coater so that the film thickness of the thermally conductive sheet after curing Was 250 μm, dried at 100° C. for 30 minutes, and then thermally cured at 180° C. for 4 hours to obtain a thermally conductive sheet laminate. Thereafter, the PET film was peeled off, and the thermal diffusivity of the thermally conductive sheet was measured using a laser flash method thermal diffusivity measuring apparatus LFA447 manufactured by NETZSCH. The specific gravity of the thermally conductive sheet was measured by the Archimedes method, and the specific heat of the thermally conductive sheet was measured by the DSC method. From the obtained measured values, the thermal conductivity was calculated by the calculation formula of thermal diffusivity (m$^2$/s)×specific gravity (kg/m$^3$)×specific heat (J/kg·K).

<Elastic Modulus>

After peeling off the PET film of the thermally conductive sheet laminate obtained by the above method, the thermally conductive sheet was cut into a rectangular shape of 30 mm×5 mm, and the elastic modulus of the thermally conductive sheet was measured using a dynamic viscoelasticity measuring apparatus DVA-200 manufactured by IT Measurement Control Co., Ltd. The storage elastic moduli at each temperature in the range from −70° C. to 300° C. were measured under the measurement conditions of temperature rise rate: 5° C./min and measurement frequency: 1 Hz, and the value of the storage elastic modulus at 25° C. was taken as the elastic modulus.

<Tackiness>

After peeling off the PET film of the thermally conductive sheet laminate obtained by the above method, the thermally conductive sheet was cut into a square shape of 50 mm×50 mm. A copper plate having a size of 30 mm×30 mm and a thickness of 5 mm was placed on the thermally conductive sheet and held for 10 minutes. Then, the tackiness was evaluated by holding and lifting only the copper plate, and visually observing whether the thermally conductive sheet was adhered to the copper plate. The thermally conductive sheet that was adhered to the copper plate was evaluated as "good", and the thermally conductive sheet that was not adhered to and separated from the copper plate was evaluated as "bad".

<Thermal Responsiveness>

After peeling off the PET film of the thermally conductive sheet laminate obtained by the above method, the thermally conductive sheet was cut into a square shape of 55 mm×55 mm. The cut thermally conductive sheet was bonded to an aluminum plate having a size of 60 mm×60 mm and a thickness of 2 mm using a rubber roll at room temperature.

Further, a copper plate having a size of 50 mm×50 mm and a thickness of 2 mm was placed on the thermally conductive sheet, and pressed and laminated at a pressure of 0.5 MPa at room temperature to obtain a sample. The sample was placed on a hot plate set at 250° C. with the aluminum plate facing downward and the temperature at the top of the copper plate of the sample was measured using a contact thermometer. The time from when the sample was placed on the hot plate until when the temperature at the top of the copper plate reached 150° C. was measured.

<Toughness>

After peeling off the PET film of the thermally conductive sheet laminate obtained by the above method, the thermally conductive sheet was cut into a square shape of 50 mm×50 mm. The cut thermally conductive sheet was wound along an aluminum cylinder having a diameter of 3 mm and a height of 100 mm. The wound thermally conductive sheet was visually observed to evaluate the toughness. The thermally conductive sheet having no crack confirmed was evaluated as "good", and the thermally conductive sheet having a crack was evaluated as "bad".

<Heat Resistance>

After peeling off the PET film of the thermally conductive sheet laminate obtained by the above method, the thermally conductive sheet was cut into a square shape of 30 mm×30 mm. Then an aluminum plate having a size of 60 mm×60 mm and a thickness of 1 mm was laminated on both sides of the thermally conductive sheet to obtain a sample. The sample was allowed to stand in a hot air circulation thermostat at 250° C. for 168 hours. After 168 hours, the sample was taken out, and the heat resistance was evaluated by putting a spatula between the aluminum plate and the thermally conductive sheet, and trying peeling off the thermally conductive sheet. The thermally conductive sheet that was successfully peeled off with the spatula was evaluated as "good", and the thermally conductive sheet that was fixed to the aluminum plate and was not peeled off was evaluated as "bad".

<Peel Strength After Heat Resistance Test>

After peeling off the PET film of the thermally conductive sheet laminate obtained by the above method, the thermally conductive sheet was cut into a rectangular shape of 24 mm×90 mm. The cut thermally conductive sheet was bonded onto a silicon wafer using a rubber roll at room temperature. Thereafter, the silicon wafer was placed on a hot plate at 250° C. and allowed to stand for 10 hours. Thereafter, the silicon wafer was cooled to room temperature, the thermally conductive sheet was peeled off in a direction of 90°, and the peel strength was measured with a universal testing machine AGS-X manufactured by Shimadzu Corporation. The measurement was carried out at the load cell of 50 N and the pulling rate of 10 mm/min.

Example 1

A stirrer, a thermometer, a nitrogen introducing tube, and a dropping funnel were set to a 300 ml four-necked flask, and 88.39 g of triglyme and 14.56 g of BPDA were charged thereto under a nitrogen atmosphere, and stirred and dissolved at 60° C. Thereafter, while stirring at 60° C., 1.83 g of BAHF and 72.00 g of X-22-161A were added thereto, and the mixture was further stirred for 1 hour. Thereafter, the mixture was heated to 180° C., stirred for 3 hours, and then cooled to room temperature to obtain a solution of polyimide resin A dissolved in triglyme (solid content concentration: 50.0% by weight). The weight average molecular weight of the polyimide resin A was measured and found to be 45,300, and the imidization rate was measured and found to be 99%.

To 5.04 g of the solution of the polyimide resin A obtained by the above method, 0.28 g of X-40-2695B and 0.005 g of 2P4MZ were added, and the mixture was mixed and stirred. AA3 (9 g) and AA07 (7 g) were added thereto and the mixture was repeatedly kneaded five times with a triple roll mill to obtain a viscous liquid resin composition. Separately, only the polyimide resin A and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 2

A stirrer, a thermometer, a nitrogen introducing tube and a dropping funnel were set to a 300 ml four-necked flask, and 87.99 g of triglyme and 14.56 g of BPDA were charged thereto under a nitrogen atmosphere, and stirred and dissolved at 60° C. Thereafter, while stirring at 60° C., 1.43 g of MBAA and 72.00 g of X-22-161A were added thereto, and the mixture was further stirred for 1 hour. Thereafter, the mixture was heated to 180° C., stirred for 3 hours, and then cooled to room temperature to obtain a solution of polyimide resin B (solid content concentration: 50.0% by weight). The weight average molecular weight of the polyimide resin B was measured and found to be 36,800, and the imidization rate was measured and found to be 99%. A resin composition was obtained in the same manner as in Example 1 except that 5.04 g of the solution of the polyimide resin B was used instead of 5.04 g of the solution of the polyimide resin A. Separately, only the polyimide resin B and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 3

A stirrer, a thermometer, a nitrogen introducing tube and a dropping funnel were set to a 300 ml four-necked flask, and 88.46 g of triglyme and 14.56 g of BPDA were charged thereto under a nitrogen atmosphere, and stirred and dissolved at 60° C. Thereafter, while stirring at 60° C., 1.90 g of NJM-06 and 72.00 g of X-22-161A were added thereto, and the mixture was further stirred for 1 hour. Thereafter, the mixture was heated to 180° C., stirred for 3 hours, and then cooled to room temperature to obtain a solution of polyimide resin C dissolved in triglyme (solid content concentration: 50.0% by weight). The weight average molecular weight of the polyimide resin C was measured and found to be 35,580, and the imidization rate was measured and found to be 99%. A resin composition was obtained in the same manner as in Example 1 except that 5.04 g of the solution of the polyimide resin C was used instead of 5.04 g of the solution of the polyimide resin A. Separately, only the polyimide resin C and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 4

A stirrer, a thermometer, a nitrogen introducing tube and a dropping funnel were set to a 300 ml four-necked flask, and 88.79 g of triglyme and 15.36 g of ODPA were charged thereto under a nitrogen atmosphere, and stirred and dissolved at 60° C. Thereafter, while stirring at 60° C., 1.43 g of MBAA and 72.00 g of X-22-161A were added thereto, and the mixture was further stirred for 1 hour. Thereafter, the mixture was heated to 180° C., stirred for 3 hours, and then cooled to room temperature to obtain a solution of polyimide resin D dissolved in triglyme (solid content concentration: 50.0% by weight). The weight average molecular weight of the polyimide resin D was measured and found to be 39,820, and the imidization rate was measured and found to be 99%. A resin composition was obtained in the same manner as in Example 1 except that 5.04 g of the solution of the polyimide resin D was used instead of 5.04 g of the solution of the polyimide resin A. Separately, only the polyimide resin D and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 5

A stirrer, a thermometer, a nitrogen introducing tube and a dropping funnel were set to a 300 ml four-necked flask, and 95.42 g of triglyme and 21.99 g of 6FDA were charged thereto under a nitrogen atmosphere, and stirred and dissolved at 60° C. Thereafter, while stirring at 60° C., 1.43 g of MBAA and 72.00 g of X-22-161A were added thereto, and the mixture was further stirred for 1 hour. Thereafter, the mixture was heated to 180° C., stirred for 3 hours, and then cooled to room temperature to obtain a solution of polyimide resin E dissolved in triglyme (solid content concentration: 50.0% by weight). The weight average molecular weight of the polyimide resin E was measured and found to be 36,620, and the imidization rate was measured and found to be 99%. A resin composition was obtained in the same manner as in Example 1 except that 5.04 g of the solution of the polyimide resin E was used instead of 5.04 g of the solution of the polyimide resin A. Separately, only the polyimide resin E and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 6

A viscous liquid resin composition was obtained in the same manner as in Example 4 except that 0.28 g of JER630 was added instead of 0.28 g of X-40-2695B. Separately, only the polyimide resin D and JER630 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 7

A viscous liquid resin composition was obtained in the same manner as in Example 4 except that 0.28 g of HP4032 was added instead of 0.28 g of X-40-2695B. Separately, only the polyimide resin D and HP4032 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 8

A viscous liquid resin composition was obtained in the same manner as in Example 4 except that 0.28 g of TEPIC-PAS B22 was added instead of 0.28 g of X-40-2695B. Separately, only the polyimide resin D and TEPIC-PAS B22 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 9

A viscous liquid resin composition was obtained in the same manner as in Example 4 except that 0.28 g of JER828 was added instead of 0.28 g of X-40-2695B. Separately, only the polyimide resin D and JER828 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 10

A viscous liquid resin composition was obtained in the same manner as in Example 4 except that 0.28 g of NIKA-LAC MX270 was added instead of 0.28 g of X-40-2695B. Separately, only the polyimide resin D and NIKALAC MX270 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 11

A viscous liquid resin composition was obtained in the same manner as in Example 5 except that 0.28 g of JER630 was added instead of 0.28 g of X-40-2695B. Separately, only the polyimide resin E and JER630 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 12

A viscous liquid resin composition was obtained in the same manner as in Example 2 except that 0.28 g of JER630 was added instead of 0.28 g of X-40-2695B. Separately, only the polyimide resin B and JER630 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 13

A viscous liquid resin composition was obtained in the same manner as in Example 4 except that 5.30 g of the solution of the polyimide resin D was used and the addition amount of X-40-2695B was changed to 0.15 g. Separately, only the polyimide resin D and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 14

A viscous liquid resin composition was obtained in the same manner as in Example 4 except that 5.46 g of the solution of the polyimide resin D was used and the addition amount of X-40-2695B was changed to 0.07 g. Separately, only the polyimide resin D and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 15

A viscous liquid resin composition was obtained in the same manner as in Example 4 except that 4.30 g of the solution of the polyimide resin D was used and the addition amount of X-40-2695B was changed to 0.65 g. Separately, only the polyimide resin D and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 16

A viscous liquid resin composition was obtained in the same manner as in Example 15 except that 0.65 g of JER630 was added instead of 0.65 g of X-40-2695B. Separately, only the polyimide resin D and JER630 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 17

A viscous liquid resin composition was obtained in the same manner as in Example 15 except that 0.65 g of TEPIC-PAS B22 was added instead of 0.65 g of X-40-2695B. Separately, only the polyimide resin D and TEPIC-PAS B22 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 18

A viscous liquid resin composition was obtained in the same manner as in Example 4 except that 9 g of AA18 was added instead of 9 g of AA3. With respect to the obtained resin composition, thermal conductivity, elastic modulus, tackiness, thermal responsiveness, toughness, heat resistance, and peel strength after the heat resistance test were evaluated by the above method.

Example 19

A viscous liquid resin composition was obtained in the same manner as in Example 4 except that 9 g of DAW45 was added instead of 9 g of AA3. With respect to the obtained resin composition, thermal conductivity, elastic modulus, tackiness, thermal responsiveness, toughness, heat resistance, and peel strength after the heat resistance test were evaluated by the above method.

Example 20

A viscous liquid resin composition was obtained in the same manner as in Example 4 except that 7 g of FAN-10 was added instead of 9 g of AA3. With respect to the obtained resin composition, thermal conductivity, elastic modulus, tackiness, thermal responsiveness, toughness, heat resistance, and peel strength after the heat resistance test were evaluated by the above method.

Example 21

A viscous liquid resin composition was obtained in the same manner as in Example 4 except that 16 g of AA07 was added instead of 9 g of AA3 and 7 g of AA07. With respect to the obtained resin composition, thermal conductivity, elastic modulus, tackiness, thermal responsiveness, toughness, heat resistance, and peel strength after the heat resistance test were measured by the above method.

Example 22

A viscous liquid resin composition was obtained in the same manner as in Example 20 except that 16 g of AA18 was added instead of 16 g of AA07. With respect to the obtained resin composition, thermal conductivity, elastic modulus, tackiness, thermal responsiveness, toughness, heat resistance, and peel strength after the heat resistance test were measured by the above method.

Example 23

A viscous liquid resin composition was obtained in the same manner as in Example 6 except that 7 g of FAN-10 was added instead of 9 g of AA3. With respect to the obtained resin composition, thermal conductivity, elastic modulus, tackiness, thermal responsiveness, toughness, heat resistance, and peel strength after the heat resistance test were measured by the above method.

Example 24

A viscous liquid resin composition was obtained in the same manner as in Example 6 except that 16 g of AA07 was added instead of 9 g of AA3 and 7 g of AA07. With respect to the obtained resin composition, thermal conductivity, elastic modulus, tackiness, thermal responsiveness, toughness, heat resistance, and peel strength after the heat resistance test were measured by the above method.

Example 25

A viscous liquid resin composition was obtained in the same manner as in Example 23 except that 16 g of AA18 was added instead of 16 g of AA07. With respect to the obtained resin composition, thermal conductivity, elastic modulus, tackiness, thermal responsiveness, toughness, heat resistance, and peel strength after the heat resistance test were measured by the above method.

Example 26

A stirrer, a thermometer, a nitrogen introducing tube and a dropping funnel were set to a 300 ml four-necked flask, and 69.08 g of triglyme and 15.36 g of ODPA were charged thereto under a nitrogen atmosphere, and stirred and dissolved at 60° C. Thereafter, while stirring at 60° C., 5.73 g of MBAA and 48.00 g of X-22-161A were added thereto, and the mixture was further stirred for 1 hour. Thereafter, the mixture was heated to 180° C., stirred for 3 hours, and then cooled to room temperature to obtain a solution of polyimide resin H dissolved in triglyme (solid content concentration: 50.0% by weight). The weight average molecular weight of the polyimide resin H was measured and found to be 49,820, and the imidization rate was measured and found to be 99%. A viscous liquid resin composition was obtained in the same manner as in Example 1 except that the polyimide resin H was used instead of the polyimide resin A. Separately, only the polyimide resin H and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were measured by the above method.

Example 27

A stirrer, a thermometer, a nitrogen introducing tube and a dropping funnel were set to a 300 ml four-necked flask, and 82.22 g of triglyme and 15.36 g of ODPA were charged thereto under a nitrogen atmosphere, and stirred and dissolved at 60° C. Thereafter, while stirring at 60° C., 2.86 g of MBAA and 64.00 g of X-22-161A were added thereto, and the mixture was further stirred for 1 hour. Thereafter, the mixture was heated to 180° C., stirred for 3 hours, and then cooled to room temperature to obtain a solution of polyimide resin I dissolved in triglyme (solid content concentration: 50.0% by weight). The weight average molecular weight of the polyimide resin I was measured and found to be 44,320, and the imidization rate was measured and found to be 99%. A viscous liquid resin composition was obtained in the same manner as in Example 1 except that the polyimide resin I was used instead of the polyimide resin A. Separately, only the polyimide resin I and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were measured by the above method.

Example 28

A stirrer, a thermometer, a nitrogen introducing tube and a dropping funnel were set to a 300 ml four-necked flask, and 151.79 g of triglyme and 15.36 g of ODPA were charged thereto under a nitrogen atmosphere, and stirred and dissolved at 60° C. Thereafter, while stirring at 60° C., 1.43 g of MBAA and 135.00 g of X-22-161B were added thereto, and the mixture was further stirred for 1 hour. Thereafter, the mixture was heated to 180° C., stirred for 3 hours, and then cooled to room temperature to obtain a solution of polyimide resin J dissolved in triglyme (solid content concentration: 50.0% by weight). The weight average molecular weight of the polyimide resin J was measured and found to be 36,820, and the imidization rate was measured and found to be 99%. A viscous liquid resin composition was obtained in the same manner as in Example 1 except that the polyimide resin J was used instead of the polyimide resin A. Separately, only the polyimide resin J and X-40-2695B were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were measured by the above method.

Example 29

A viscous liquid resin composition was obtained in the same manner as in Example 28 except that 0.65 g of TEPIC-PAS B22 was added instead of 0.65 g of X-40-2695B. Separately, only the polyimide resin J and TEPIC-PAS B22 were mixed at the same ratio, the mixture was cured, and the specific gravity was measured and found to be 1.2 g/cm$^3$. With respect to the obtained resin composition, thermal conductivity, elastic modulus, tackiness, thermal responsiveness, toughness, heat resistance, and peel strength after the heat resistance test were evaluated by the above method.

Example 30

A stirrer, a thermometer, a nitrogen introducing tube and a dropping funnel were set to a 300 ml four-necked flask, and 151.79 g of triglyme and 15.36 g of ODPA were charged thereto under a nitrogen atmosphere, and stirred and dissolved at 60° C. Thereafter, while stirring at 60° C., 1.43 g of MBAA and 135.00 g of X-22-161B were added thereto, and the mixture was further stirred for 1 hour. Thereafter, the mixture was heated to 180° C., stirred for 3 hours, and then cooled to room temperature to obtain a solution of polyimide resin K dissolved in triglyme (solid content concentration: 50.0% by weight). The weight average molecular weight of the polyimide resin K was measured and found to be 35,540, and the imidization rate was measured and found to be 99%. A viscous liquid resin composition was obtained in the same manner as in Example 1 except that the polyimide resin K was used instead of the polyimide resin A. Separately, only the polyimide resin K and X-40-2695B were mixed at the same ratio, the mixture was cured, and the specific gravity was measured and found to be 1.2 g/cm³. With respect to the obtained resin composition, thermal conductivity, elastic modulus, tackiness, thermal responsiveness, toughness, heat resistance, and peel strength after the heat resistance test were measured by the above method.

Comparative Example 1

To 2.8 g of triglyme, 2.8 g of JER828 and 0.005 g of 2P4MZ were added and the mixture was mixed. AA3 (9 g) and AA07 (7 g) were added thereto and the mixture was repeatedly kneaded five times with a triple roll mill to obtain a viscous liquid resin composition. Separately, JER828 was cured, and the specific gravity was measured and found to be 1.2 g/cm³. With respect to the obtained resin composition, thermal conductivity, elastic modulus, tackiness, thermal responsiveness, toughness, heat resistance, and peel strength after the heat resistance test were measured by the above method. For the peeling strength, the thermally conductive sheet was not successfully peeled off because the sheet was significantly fixed and weakened.

Comparative Example 2

A stirrer, a thermometer, a nitrogen introducing tube and a dropping funnel were set to a 300 ml four-necked flask, and 55.15 g of triglyme and 14.56 g of BPDA were charged thereto under a nitrogen atmosphere, and stirred and dissolved at 60° C. Thereafter, while stirring at 60° C., 8.59 g of MBAA and 32.00 g of X-22-161A were added thereto, and the mixture was further stirred for 1 hour. Thereafter, the mixture was heated to 180° C., stirred for 3 hours, and then cooled to room temperature to obtain a solution of polyimide resin F dissolved in triglyme (solid content concentration: 50.0% by weight). The weight average molecular weight of the polyimide resin F was measured and found to be 66,800, and the imidization rate was measured and found to be 99%. A viscous liquid resin composition was obtained in the same manner as in Example 1 except that the polyimide resin F was used instead of the polyimide resin A. Separately, only the polyimide resin F and X-40-2695B were mixed at the same ratio, the mixture was cured, and the specific gravity was measured and found to be 1.2 g/cm³. With respect to the obtained resin composition, thermal conductivity, elastic modulus, tackiness, thermal responsiveness, toughness, heat resistance, and peel strength after the heat resistance test were measured by the above method.

Comparative Example 3

A stirrer, a thermometer, a nitrogen introducing tube and a dropping funnel were set to a 300 ml four-necked flask, and 54.69 g of triglyme and 14.56 g of BPDA were charged thereto under a nitrogen atmosphere, and stirred and dissolved at 60° C. Thereafter, while stirring at 60° C., 1.43 g of MBAA and 38.70 g of K° F.8010 were added thereto, and the mixture was further stirred for 1 hour. Thereafter, the mixture was heated to 180° C., stirred for 3 hours, and then cooled to room temperature to obtain a solution of polyimide resin G (solid content concentration: 50.0% by weight). The weight average molecular weight of the polyimide resin G was measured and found to be 42,200, and the imidization rate was measured and found to be 99%. A viscous liquid resin composition was obtained in the same manner as in Example 1 except that the polyimide resin G was used instead of the polyimide resin A. Separately, only the polyimide resin G and X-40-2695B were mixed at the same ratio, the mixture was cured, and the specific gravity was measured and found to be 1.2 g/cm³. With respect to the obtained resin composition, thermal conductivity, elastic modulus, tackiness, thermal responsiveness, toughness, heat resistance, and peel strength after the heat resistance test were measured by the above method.

Comparative Example 4

AA3 (9 g) and AA07 (7 g) were added to the solution of the polyimide resin D (5.60 g) and the mixture was repeatedly kneaded five times with a triple roll mill to obtain a viscous liquid resin composition. Separately, the polyimide resin D was cured, and the specific gravity was measured and found to be 1.2 g/cm³. With respect to the obtained resin composition, thermal conductivity, elastic modulus, tackiness, thermal responsiveness, toughness, heat resistance, and peel strength after the heat resistance test were measured by the above method. For the peeling strength, the thermally conductive sheet was not successfully peeled off because the sheet was significantly fixed and weakened.

The monomer components and properties of the polyimide resin produced according to the method described in each Example and Comparative Example are shown in Table 1, and the compositions and evaluation results of the resin composition obtained in each Example and Comparative Example are shown in Tables 2 to 5.

TABLE 1

| Item | | Polyimide resin A | Polyimide resin B | Polyimide resin C | Polyimide resin D | Polyimide resin E | Polyimide resin F |
|---|---|---|---|---|---|---|---|
| Tetra carboxylic dianhydride (Mol %) | BPDA | 99 | 99 | 99 | — | — | 99 |
| | ODPA | — | — | — | 99 | — | — |
| | 6FDA | — | — | — | — | 99 | — |
| Diamine (Mol %) | BAHF | 10 | — | — | — | — | — |
| | MBAA | — | 10 | — | 10 | 10 | 60 |
| | NJM-06 | — | — | 10 | — | — | — |
| | APB | — | — | — | — | — | — |

TABLE 1-continued

|  |  |  |  |  |  |  |  |
|---|---|---|---|---|---|---|---|
|  | X-22-161A | 90 | 90 | 90 | 90 | 90 | 40 |
|  | X-22-161B | — | — | — | — | — | — |
|  | KF8010 | — | — | — | — | — | — |
| Properties | Imidization rate (%) | 99 | 99 | 99 | 99 | 99 | 99 |
|  | Weight average molecular weight | 45300 | 36800 | 35580 | 39820 | 36620 | 66800 |

| Item | | Polyimide resin G | Polyimide resin H | Polyimide resin I | Polyimide resin J | Polyimide resin K |
|---|---|---|---|---|---|---|
| Tetra carboxylic dianhydride (Mol %) | BPDA | 99 | — | — | — | — |
|  | ODPA | — | 99 | 99 | 99 | 99 |
|  | 6FDA | — | — | — | — | — |
| Diamine (Mol %) | BAHF | — | — | — | — | — |
|  | MBAA | 10 | 40 | 20 | 10 | — |
|  | NJM-06 | — | — | — | — | — |
|  | APB | — | — | — | — | 10 |
|  | X-22-161A | — | 60 | 80 | — | 90 |
|  | X-22-161B | — | — | — | 90 | — |
|  | KF8010 | 90 | — | — | — | — |
| Properties | Imidization rate (%) | 99 | 99 | 99 | 99 | 99 |
|  | Weight average molecular weight | 42200 | 49820 | 44320 | 36820 | 35540 |

TABLE 2

| | Item | Example 1 | Example 2 | Example 3 | Example 4 | Example 5 |
|---|---|---|---|---|---|---|
| Polyimide resin (g) | Polyimide resin A | 2.52 | — | — | — | — |
|  | Polyimide resin B | — | 2.52 | — | — | — |
|  | Polyimide resin C | — | — | 2.52 | — | — |
|  | Polyimide resin D | — | — | — | 2.52 | — |
|  | Polyimide resin E | — | — | — | — | 2.52 |
| Thermosetting resin (g) | X-40-2695B | 0.28 | 0.28 | 0.28 | 0.28 | 0.28 |
|  | JER630 | — | — | — | — | — |
|  | HP4032 | — | — | — | — | — |
|  | TEPIC-PAS B22 | — | — | — | — | — |
|  | JER828 | — | — | — | — | — |
|  | NIKALAC MX 270 | — | — | — | — | — |
| Curing agent (g) | 2P4MZ | 0.005 | 0.005 | 0.005 | 0.005 | 0.005 |
| Thermally conductive filler (g) | AA3 | 9 | 9 | 9 | 9 | 9 |
|  | AA07 | 7 | 7 | 7 | 7 | 7 |
| Thermally conductive filler content (parts by volume) | | 63.2 | 63.2 | 63.2 | 63.2 | 63.2 |
| Evaluation results | Thermal conductivity (W/mK) | 0.8 | 1.8 | 1.9 | 1.8 | 1.8 |
|  | Elastic modulus (MPa) | 20 | 35 | 30 | 6 | 3 |
|  | Tackiness | Good | Good | Good | Good | Good |
|  | Thermal responsiveness (sec) | 280 | 230 | 220 | 200 | 200 |
|  | Toughness | Good | Good | Good | Good | Good |
|  | Heat resistance | Good | Good | Good | Good | Good |
|  | Peel strength after heat resistance test (N/cm) | 1.3 | 1.3 | 1.3 | 1.5 | 1.1 |

| | Item | Example 6 | Example 7 | Example 8 | Example 9 | Example 10 |
|---|---|---|---|---|---|---|
| Polyimide resin (g) | Polyimide resin A | — | — | — | — | — |
|  | Polyimide resin B | — | — | — | — | — |
|  | Polyimide resin C | — | — | — | — | — |
|  | Polyimide resin D | 2.52 | 2.52 | 2.52 | 2.52 | 2.52 |
|  | Polyimide resin E | — | — | — | — | — |
| Thermosetting resin (g) | X-40-2695B | — | — | — | — | — |
|  | JER630 | 0.28 | — | — | — | — |
|  | HP4032 | — | 0.28 | — | — | — |
|  | TEPIC-PAS B22 | — | — | 0.28 | — | — |
|  | JER828 | — | — | — | 0.28 | — |
|  | NIKALAC MX 270 | — | — | — | — | 0.28 |

TABLE 2-continued

| | | | | | | |
|---|---|---|---|---|---|---|
| Curing agent (g) | 2P4M2 | 0.005 | 0.005 | 0.005 | 0.005 | — |
| Thermally conductive filler (g) | AA3 | 9 | 9 | 9 | 9 | 9 |
| | AA07 | 7 | 7 | 7 | 7 | 7 |
| Thermally conductive filler content (parts by volume) | | 63.2 | 63.2 | 63.2 | 63.2 | 63.2 |
| Evaluation results | Thermal conductivity (W/mK) | 2.0 | 2.1 | 2.0 | 2.5 | 2.0 |
| | Elastic modulus (MPa) | 13 | 15 | 10 | 9 | 40 |
| | Tackiness | Good | Good | Good | Good | Good |
| | Thermal responsiveness (sec) | 210 | 200 | 200 | 200 | 240 |
| | Toughness | Good | Good | Good | Good | Good |
| | Heat resistance | Good | Good | Good | Good | Good |
| | Peel strength after heat resistance test (N/cm) | 1.8 | 1.2 | 0.6 | 2.4 | 1.2 |

TABLE 3

| | Item | Example 11 | Example 12 | Example 13 | Example 14 | Example 15 |
|---|---|---|---|---|---|---|
| Polyimide resin (g) | Polyimide resin B | — | 2.52 | — | — | — |
| | Polyimide resin D | — | — | 2.65 | 2.73 | 2.15 |
| | Polyimide resin E | 2.52 | — | — | — | — |
| Thermosetting resin (g) | X-40-2695B | — | — | 0.15 | 0.07 | 0.65 |
| | JER630 | 0.28 | 0.28 | — | — | — |
| | TEPIC-PAS B22 | — | — | — | — | — |
| Curing agent (g) | 2P4MZ | 0.005 | 0.005 | 0.005 | 0.005 | 0.005 |
| Thermally conductive filler (g) | FAN-10 | — | — | — | — | — |
| | DAW45 | — | — | — | — | — |
| | AA18 | — | — | — | — | — |
| | AA3 | 9 | 9 | 9 | 9 | 9 |
| | AA07 | 7 | 7 | 7 | 7 | 7 |
| Thermally conductive filler content (parts by volume) | | 63.2 | 63.2 | 63.2 | 63.2 | 63.2 |
| Evaluation results | Thermal conductivity (W/mK) | 2.0 | 2.1 | 1.8 | 1.8 | 1.1 |
| | Elastic modulus (MPa) | 10 | 20 | 5 | 3 | 20 |
| | Tackiness | Good | Good | Good | Good | Good |
| | Thermal responsiveness (sec) | 200 | 210 | 200 | 200 | 250 |
| | Toughness | Good | Good | Good | Good | Good |
| | Heat resistance | Good | Good | Good | Good | Good |
| | Peel strength after heat resistance test (N/cm) | 1.4 | 1.6 | 1.9 | 2.4 | 2.6 |

| | Item | Example 16 | Example 17 | Example 18 | Example 19 | Example 20 |
|---|---|---|---|---|---|---|
| Polyimide resin (g) | Polyimide resin B | — | — | — | — | — |
| | Polyimide resin D | 2.15 | 2.15 | 2.52 | 2.52 | 2.52 |
| | Polyimide resin E | — | — | — | — | — |
| Thermosetting resin (g) | X-40-2695B | — | — | 0.28 | 0.28 | 0.28 |
| | JER630 | 0.65 | — | — | — | — |
| | TEPIC-PAS B22 | — | 0.65 | — | — | — |
| Curing agent (g) | 2P4MZ | 0.005 | 0.005 | 0.005 | 0.005 | 0.005 |
| Thermally conductive filler (g) | FAN-10 | — | — | — | — | 7 |
| | DAW45 | — | — | — | 9 | — |
| | AA18 | — | — | 9 | — | — |
| | AA3 | 9 | 9 | — | — | — |
| | AA07 | 7 | 7 | 7 | 7 | 7 |
| Thermally conductive filler content (parts by volume) | | 63.2 | 63.2 | 63.2 | 63.2 | 62.4 |
| Evaluation results | Thermal conductivity (W/mK) | 1.6 | 1.6 | 2.0 | 2.0 | 3.3 |
| | Elastic modulus (MPa) | 90 | 70 | 6 | 7 | 15 |
| | Tackiness | Good | Good | Good | Good | Good |
| | Thermal responsiveness (sec) | 330 | 280 | 200 | 200 | 180 |
| | Toughness | Good | Good | Good | Good | Good |
| | Heat resistance | Good | Good | Good | Good | Good |
| | Peel strength after heat resistance test (N/cm) | 2.8 | 1.4 | 1.6 | 1.6 | 1.5 |

TABLE 4

| Item | | Example 21 | Example 22 | Example 23 | Example 24 | Example 25 |
|---|---|---|---|---|---|---|
| | Polyimide resin D | 2.52 | 2.52 | 2.52 | 2.52 | 2.52 |
| | Polyimide resin H | — | — | — | — | — |
| | Polyimide resin I | — | — | — | — | — |
| | Polyimide resin J | — | — | — | — | — |
| | Polyimide resin K | — | — | — | — | — |
| Thermosetting resin (g) | X-40-2695B | 0.28 | 0.28 | — | — | — |
| | JER630 | — | — | 0.28 | 0.28 | 0.28 |
| | TEPIC-PAS B22 | — | — | — | — | — |
| Curing agent (g) | 2P4M5 | 0.005 | 0.005 | 0.005 | 0.005 | 0.005 |
| Thermally conductive filler (g) | FAN-10 | — | — | 7 | — | — |
| | AA18 | — | 16 | — | — | 16 |
| | AA3 | — | — | — | — | — |
| | AA07 | 16 | — | 7 | 16 | — |
| Thermally conductive filler content (parts by volume) | | 63.2 | 63.2 | 62.4 | 63.2 | 63.2 |
| Evaluation results | Thermal conductivity (W/mK) | 0.6 | 1.2 | 3.6 | 0.6 | 1.0 |
| | Elastic modulus (MPa) | 7 | 6 | 30 | 8 | 6 |
| | Tackiness | Good | Good | Good | Good | Good |
| | Thermal responsiveness (sec) | 280 | 240 | 170 | 280 | 240 |
| | Toughness | Good | Good | Good | Good | Good |
| | Heat resistance | Good | Good | Good | Good | Good |
| | Peel strength after heat resistance test (N/cm) | 1.6 | 1.5 | 1.8 | 1.9 | 1.8 |

| Item | | Example 26 | Example 27 | Example 28 | Example 29 | Example 30 |
|---|---|---|---|---|---|---|
| | Polyimide resin D | — | — | — | — | — |
| | Polyimide resin H | 2.52 | — | — | — | — |
| | Polyimide resin I | — | 2.52 | — | — | — |
| | Polyimide resin J | — | — | 2.52 | 2.52 | — |
| | Polyimide resin K | — | — | — | — | 2.52 |
| Thermosetting resin (g) | X-40-2695B | 0.28 | 0.28 | 0.28 | — | 0.28 |
| | JER630 | — | — | — | — | — |
| | TEPIC-PAS B22 | — | — | — | 0.28 | — |
| Curing agent (g) | 2P4MZ | 0.005 | 0.005 | 0.005 | 0.005 | 0.005 |
| Thermally conductive filler (g) | FAN-10 | — | — | — | — | — |
| | AA18 | — | — | — | — | — |
| | AA3 | 9 | 9 | 9 | 9 | 9 |
| | AA07 | 7 | 7 | 7 | 7 | 7 |
| Thermally conductive filler content (parts by volume) | | 63.2 | 63.2 | 63.2 | 63.2 | 63.2 |
| Evaluation results | Thermal conductivity (W/mK) | 2.7 | 2.1 | 1.4 | 1.8 | 0.6 |
| | Elastic modulus (MPa) | 400 | 100 | 2 | 4 | 5 |
| | Tackiness | Good | Good | Good | Good | Good |
| | Thermal responsiveness (sec) | 350 | 290 | 200 | 210 | 280 |
| | Toughness | Good | Good | Good | Good | Good |
| | Heat resistance | Good | Good | Good | Good | Good |
| | Peel strength after heat resistance test (N/cm) | 0.8 | 1.2 | 1.3 | 0.7 | 1.4 |

TABLE 5

| Item | | Comparative Example 1 | Comparative Example 2 | Comparative Example 3 | Comparative Example 4 |
|---|---|---|---|---|---|
| Polyimide resin (g) | Polyimide resin D | — | — | — | 2.8 |
| | Polyimide resin F | — | 2.52 | — | — |
| | Polyimide resin G | — | — | 2.52 | — |
| Thermosetting resin (g) | X-40-2695B | — | 0.28 | 0.28 | — |
| | JER828 | 2.8 | — | — | — |
| Thermally conductive filler (g) | AA18 | — | — | — | — |
| | AA3 | 9 | 9 | 9 | 9 |
| | AA07 | 7 | 7 | 7 | 7 |
| Thermally conductive filler content (parts by volume) | | 63.2 | 63.2 | 63.2 | 63.2 |

TABLE 5-continued

| Item | | Comparative Example 1 | Comparative Example 2 | Comparative Example 3 | Comparative Example 4 |
|---|---|---|---|---|---|
| Evaluation results | Thermal conductivity (W/mK) | 1.2 | 2.2 | 2.2 | 1.9 |
| | Elastic modulus (MPa) | 15000 | 6000 | 1500 | 5 |
| | Tackiness | Bad | Bad | Bad | Good |
| | Thermal responsiveness (sec) | >360 | >360 | >360 | 200 |
| | Toughness | Bad | Bad | Good | Bad |
| | Heat resistance | Bad | Good | Good | Bad |
| | Peel strength after heat resistance test (N/cm) | — | 0.4 | 1.2 | — |

The invention claimed is:

1. A resin composition comprising:
(A) a polyimide resin containing 60 mol % or more of a diamine residue having a structure represented by General Formula (1) below in all diamine residues;
(B) a thermosetting resin; and
(C) a thermally conductive filler,
Wherein
the resin composition contains 0.1 to 15 parts by weight of the thermosetting resin (B) relative to 100 parts by weight of the polyimide resin (A),
the resin composition contains 60 parts by volume or more of the thermally conductive filler (C) in 100 parts by volume of a total of the polyimide resin (A), the thermosetting resin (B), and the thermally conductive filler (C):

[Chemical Formula 1]

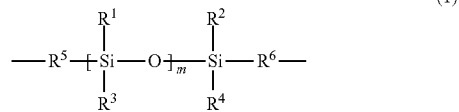

(1)

wherein $R^1$ to $R^4$ may each be same or different and represent an alkyl group having 1 to 30 carbon atoms, a phenyl group, or a phenoxy group, and the phenyl group and the phenoxy group may be substituted with an alkyl group having 1 to 30 carbon atoms; $R^1$s and $R^3$s may each be same or different; $R^5$ and $R^6$ may each be same or different and represent an alkylene group having 1 to 30 carbon atoms or an arylene group, and the arylene group may be substituted with an alkyl group having 1 to 30 carbon atoms; and m represents a range of 10 or more.

2. The resin composition according to claim 1, wherein the thermosetting resin (B) has a group selected from an epoxy group, an isocyanate group, and a methylol group.

3. The resin composition according to claim 2, wherein the thermosetting resin (B) is an epoxy resin having a siloxane skeleton.

4. The resin composition according to claim 2, wherein the thermosetting resin (B) is an epoxy resin having a triazine skeleton.

5. A power semiconductor device comprising:
a heat sink; and
a power semiconductor module,
wherein
a sheet including a cured product of the resin composition according to claim 1 is provided between the heat sink and the power semiconductor module.

6. A sheet comprising a cured product of the resin composition according to claim 1.

7. The sheet according to claim 6, having a thickness of 100 to 400 μm.

8. A laminate comprising:
a base material selected from a metal substrate and a ceramic substrate; and
the sheet according to claim 6 laminated on the base material.

9. A laminate comprising:
a heating element; and
the sheet according to claim 6 laminated on the heating element.

10. A plasma processing apparatus comprising:
a plasma source;
a mounting table having a temperature regulation mechanism; and
a temperature control plate,
wherein
the sheet according to claim 6 is provided between the mounting table having a temperature regulation mechanism and the temperature control plate.

11. The plasma processing apparatus according to claim 10, wherein the temperature control plate is a focus ring.

12. A method of producing a semiconductor, comprising a step of performing dry etching using the plasma processing apparatus according to claim 10.

* * * * *